United States Patent
Yu et al.

(10) Patent No.: US 9,922,992 B1
(45) Date of Patent: Mar. 20, 2018

(54) DOPING CHANNELS OF EDGE CELLS TO PROVIDE UNIFORM PROGRAMMING SPEED AND REDUCE READ DISTURB

(71) Applicant: SanDisk Technologies LLC, Plano, TX (US)

(72) Inventors: Xuehong Yu, San Jose, CA (US); Yingda Dong, San Jose, CA (US)

(73) Assignee: SanDisk Technologies LLC, Plano, TX (US)

(*) Notice: Subject to any disclaimer, the term of this patent is extended or adjusted under 35 U.S.C. 154(b) by 0 days.

(21) Appl. No.: 15/483,256

(22) Filed: Apr. 10, 2017

(51) Int. Cl.
*H01L 27/115* (2017.01)
*H01L 27/11582* (2017.01)
*H01L 23/528* (2006.01)
*H01L 27/11556* (2017.01)
*H01L 29/04* (2006.01)
*H01L 29/167* (2006.01)
*H01L 21/311* (2006.01)
(Continued)

(52) U.S. Cl.
CPC .. *H01L 27/11582* (2013.01); *H01L 21/02532* (2013.01); *H01L 21/02636* (2013.01); *H01L 21/2236* (2013.01); *H01L 21/2256* (2013.01); *H01L 21/31111* (2013.01); *H01L 23/528* (2013.01); *H01L 27/11556* (2013.01); *H01L 29/04* (2013.01); *H01L 29/0649* (2013.01); *H01L 29/167* (2013.01); *H01L 21/02592* (2013.01); *H01L 21/02595* (2013.01)

(58) Field of Classification Search
CPC ........... H01L 27/11582; H01L 29/0649; H01L 21/02636; H01L 21/2236; H01L 21/2256; H01L 21/02532; H01L 23/528; H01L 21/31111; H01L 29/167; H01L 29/04; H01L 27/11556; H01L 21/02592; H01L 21/02595; H01L 27/1157; H01L 27/11524; H01L 27/11575
See application file for complete search history.

(56) References Cited

U.S. PATENT DOCUMENTS 5,913,979 A 6/1999 Shen et al.
6,355,544 B1 3/2002 Essaian et al.
(Continued)

OTHER PUBLICATIONS

U.S. Appl. No. 15/175,304, filed Jun. 7, 2016 by Pang et al.
(Continued)

*Primary Examiner* — David Vu
(74) *Attorney, Agent, or Firm* — Vierra Magen Marcus LLP

(57) ABSTRACT

A three-dimensional stacked memory device provides uniform programming speeds for a block of memory cells. The channel layers of the memory strings which are relatively close to a local interconnect of a stack are doped to account for a reduced blocking oxide thickness. Channel layers of remaining memory strings are undoped. The doping can be performing by masking the channel layers which are to remain undoped while exposing the other memory holes to a dopant. The dopant can be provided, e.g., in a carrier gas, spin on glass or other solid, or by plasma doping. An n-type dopant such as antimony, arsenic or phosphorus may be used. Heating causes the dopants to diffuse into the channel layer. Another approach deposits doped silicon for some of the channel layers and undoped silicon for other channel layers.

9 Claims, 31 Drawing Sheets

(51) Int. Cl.
*H01L 29/06* (2006.01)
*H01L 21/02* (2006.01)
*H01L 21/225* (2006.01)
*H01L 21/223* (2006.01)

(56) References Cited

U.S. PATENT DOCUMENTS

| | | |
|---|---|---|
| 9,425,207 B2 | 8/2016 | Yasuda |
| 9,627,401 B2 * | 4/2017 | Tsuda ................ H01L 27/11582 |
| 2016/0071870 A1 | 3/2016 | Minami et al. |
| 2016/0079069 A1 * | 3/2016 | Uenaka ............. H01L 27/11582 |
| | | 257/326 |

OTHER PUBLICATIONS

Yoo, W.S., et al., "Spin-on-glass Bake and Cure Using a Resistively Heated Batch Annealing Oven," WaferMasters, Inc., NEC Hiroshima Ltd., Apr. 2008, 7 pages.

Filmtronics, Inc., "Spin-on Diffusants," Filmtronics Semiconductor Process Material, Rev. 6, Jul. 2004, 51 pages.

* cited by examiner

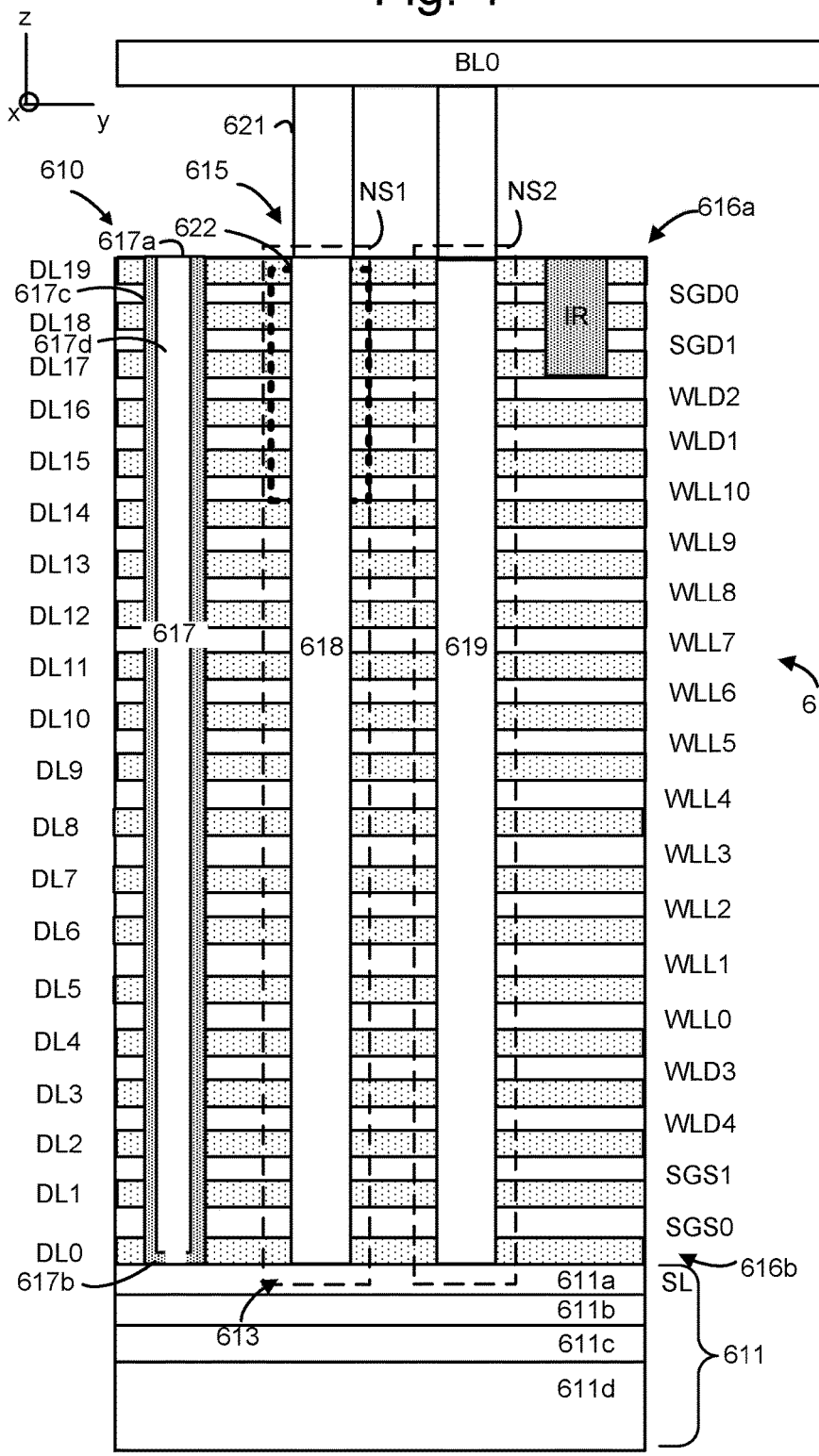
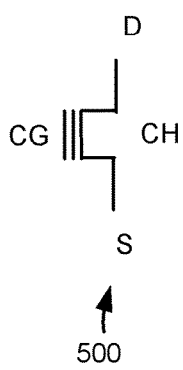
Fig. 4
Fig. 5

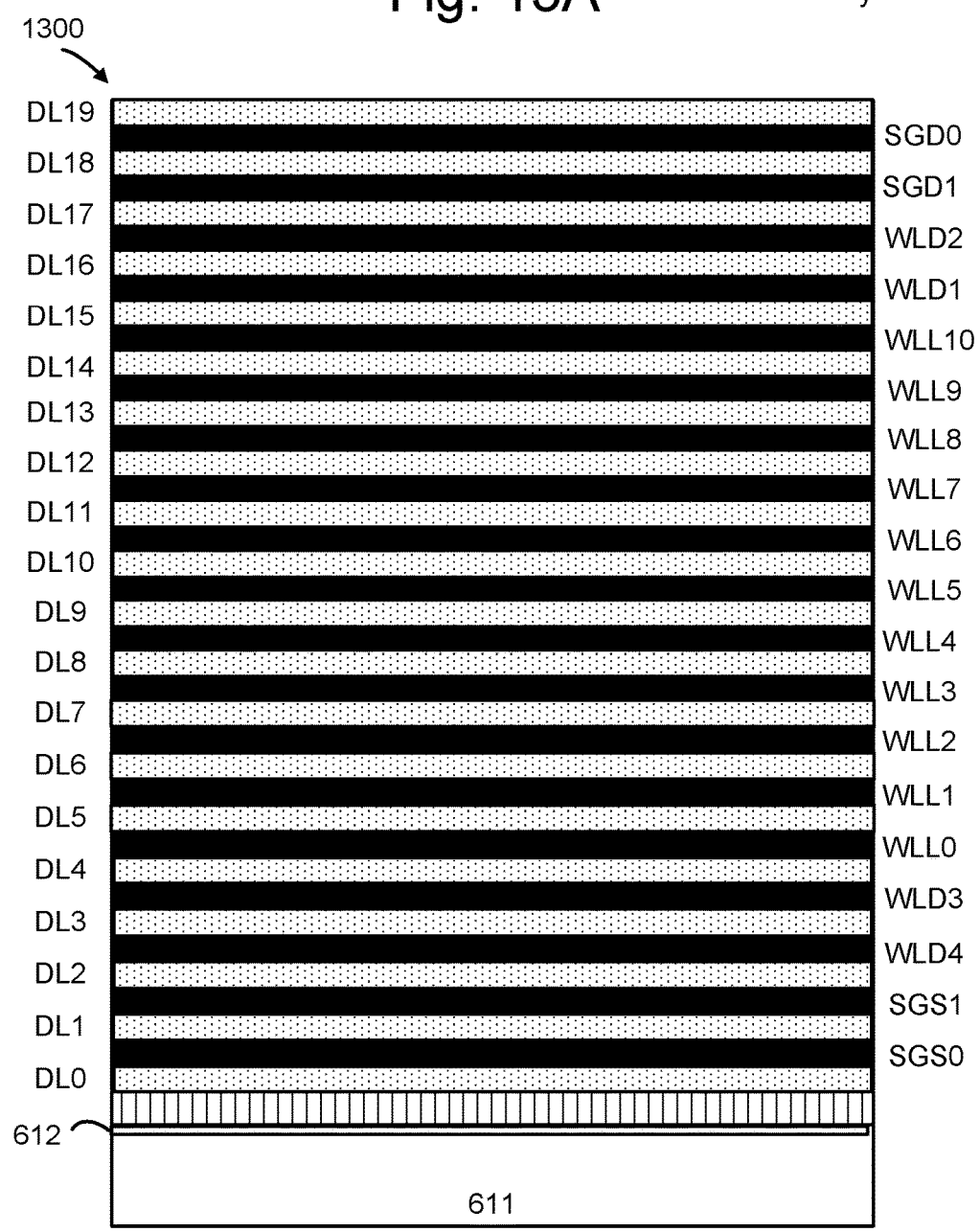

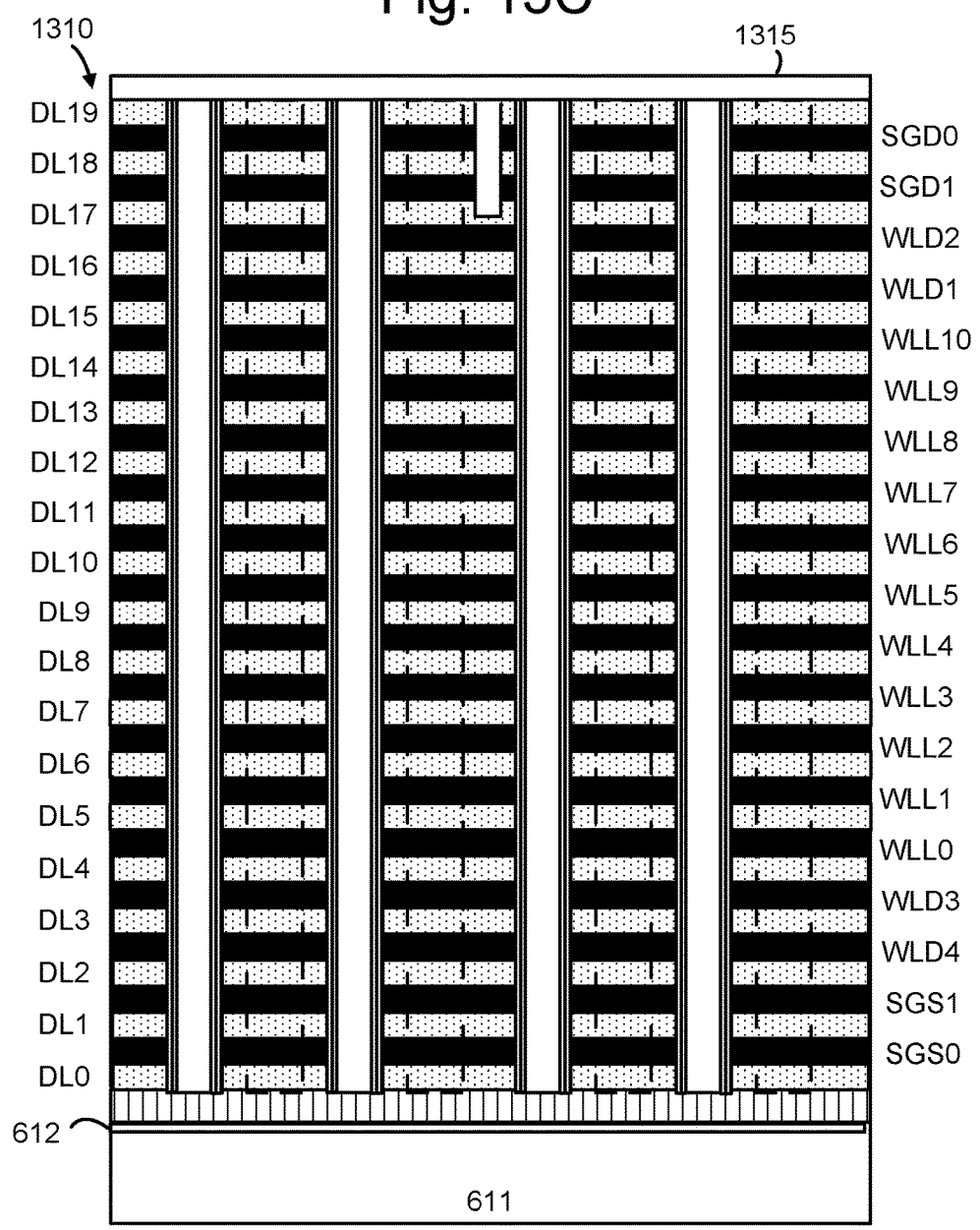

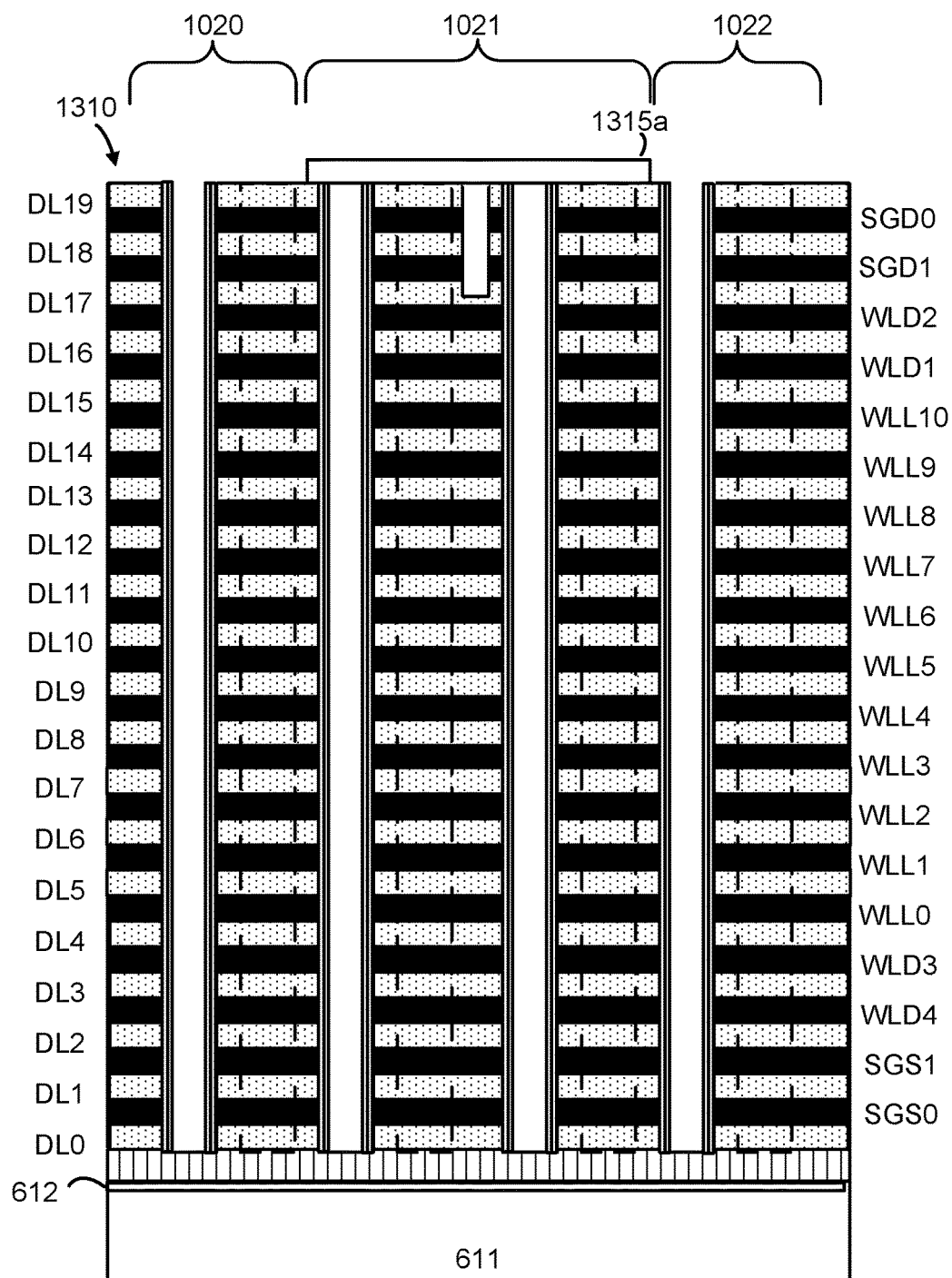
Fig. 13D1

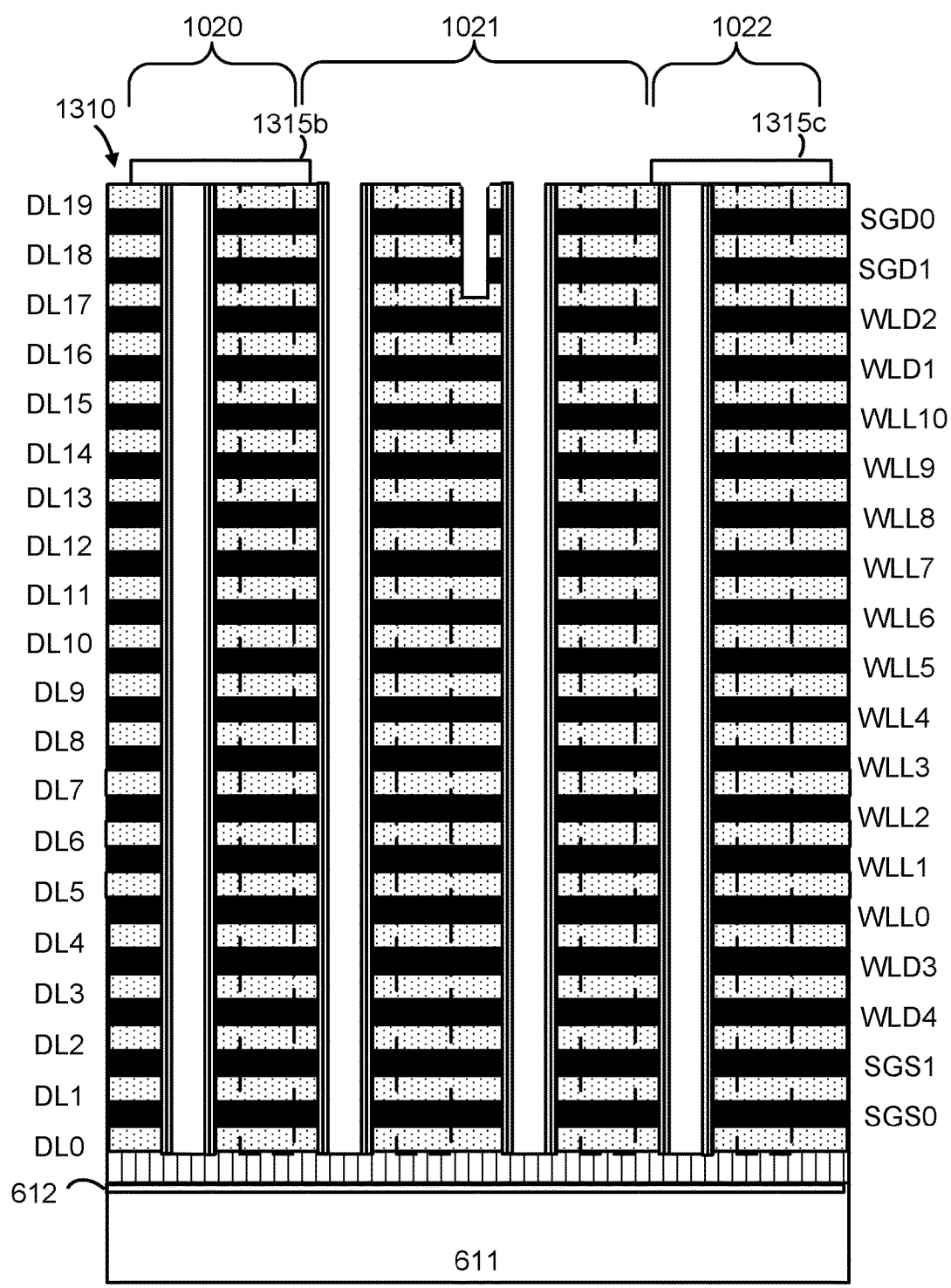
Fig. 13D2

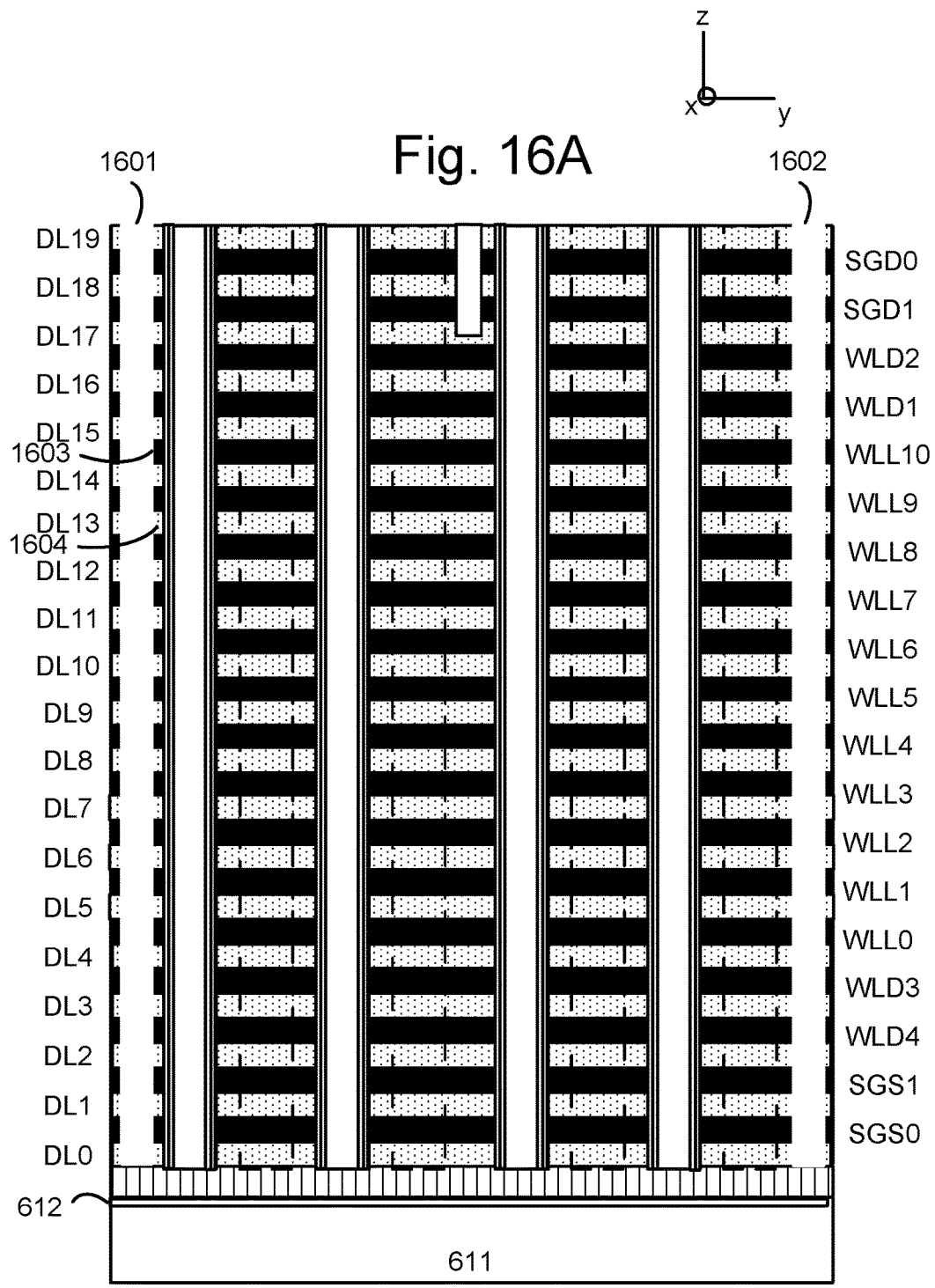

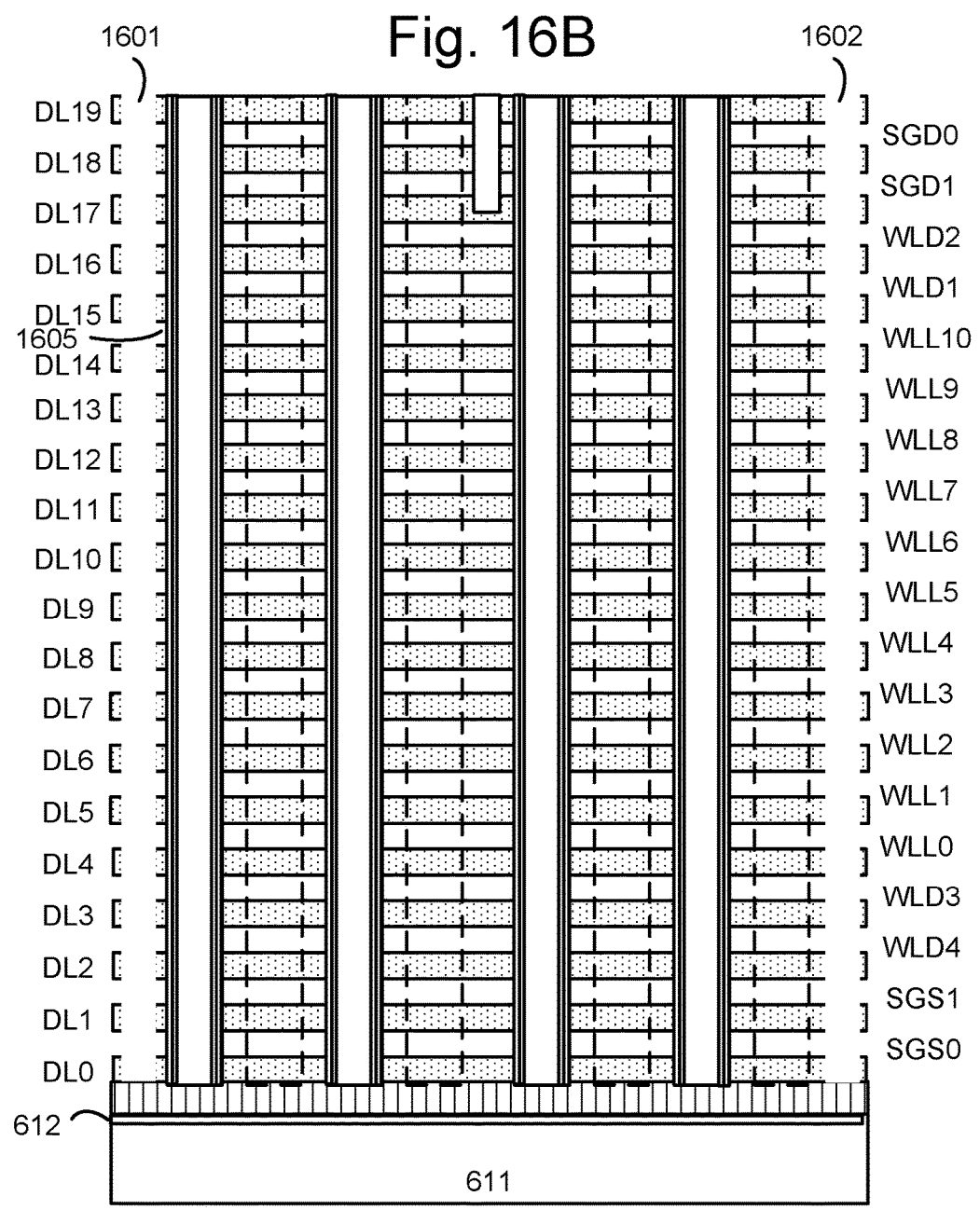

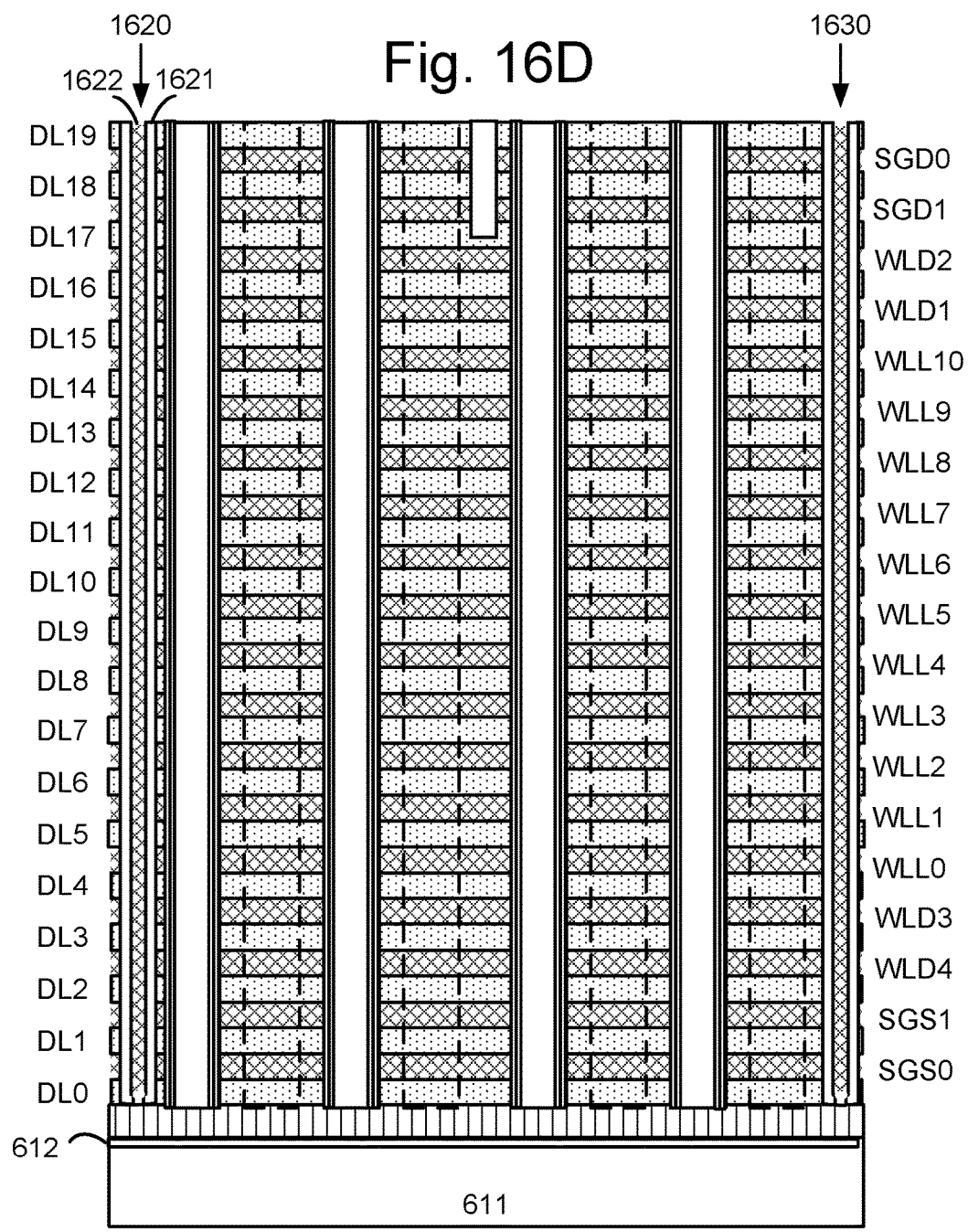

US 9,922,992 B1
// 1

DOPING CHANNELS OF EDGE CELLS TO PROVIDE UNIFORM PROGRAMMING SPEED AND REDUCE READ DISTURB

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

Like-numbered elements refer to common components in the different figures.

FIG. 4 depicts an example cross-sectional view of a portion of one of the blocks of FIG. 2 or 3.

FIG. 5 depicts an example transistor 500.

FIG. 13A depicts an example cross-sectional view of a stack of a memory device during a fabrication process consistent with step 1200 of FIG. 12A, where the stack includes alternating dielectric and control gate layers.

FIG. 13C depicts an example cross-sectional view of the stack of FIG. 13B after a material for a mask is provided on the stack, consistent with step 1210 of FIG. 12B and step 1220 of FIG. 12C.

FIG. 13D1 depicts an example cross-sectional view of the stack of FIG. 13C after the mask material is etched to form a mask over an interior region of memory holes, consistent with step 1210 of FIG. 12B, step 1220 of FIG. 12C and step 1246 of FIG. 12E.

FIG. 13D2 depicts an example cross-sectional view of the stack of FIG. 13C after the mask material is etched to form a mask over edge regions of memory holes, consistent with step 1243 of FIG. 12E.

FIG. 16A depicts an example cross-sectional view of the stack of FIG. 13D1 after slits 1601 and 1602 are formed in the stack, consistent with step 1205 of FIG. 12A.

FIG. 16B depicts an example cross-sectional view of the stack of FIG. 16A after the sacrificial material 1603 of the control gate layers is removed by providing an etchant in the slit, thereby forming a void 1605, consistent with step 1206 of FIG. 12A.

FIG. 16D depicts an example cross-sectional view of the stack of FIG. 16C after cleaning and filling in the slit, consistent with step 1207 of FIG. 12A.

DETAILED DESCRIPTION

Figure 1:
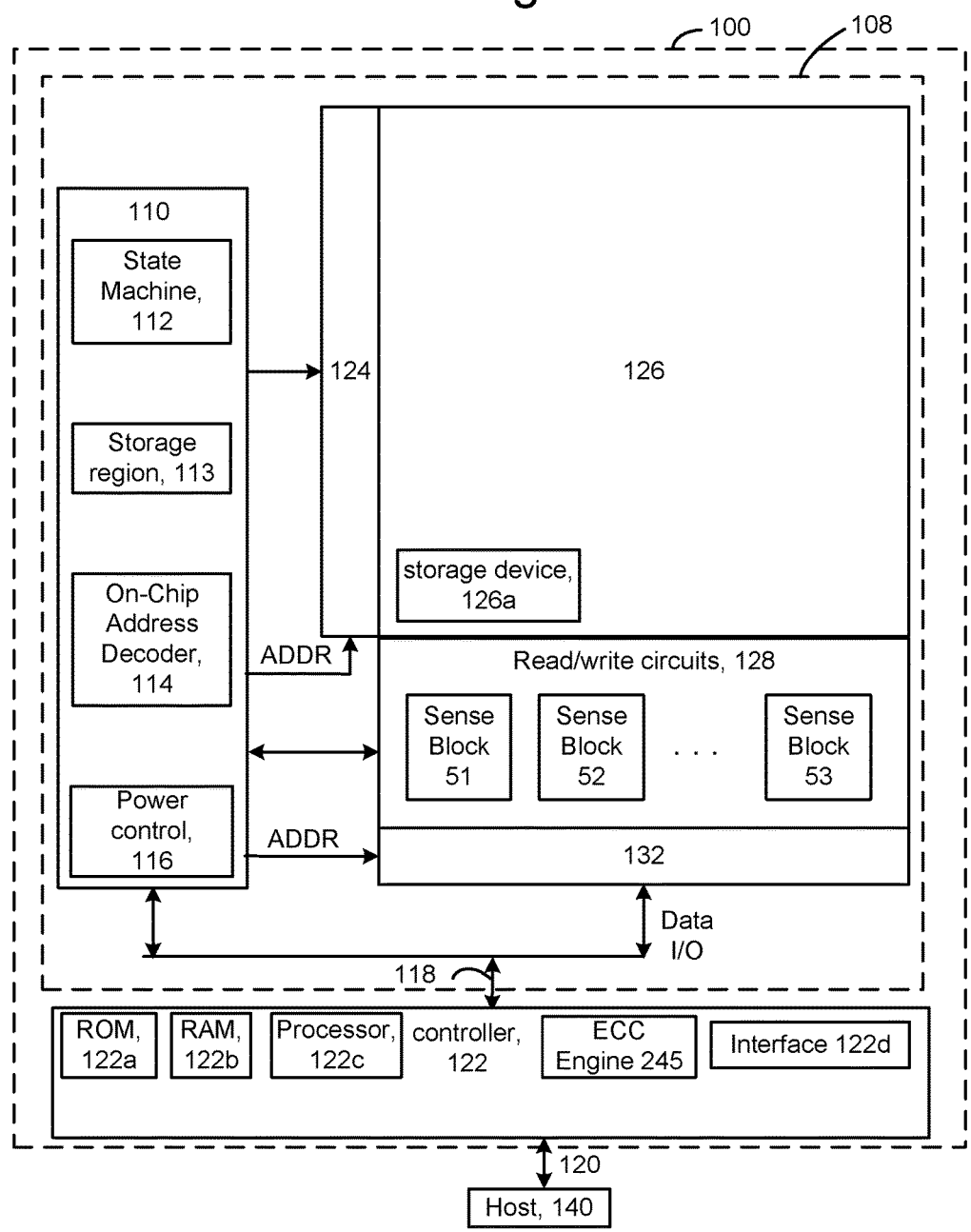
FIG. 1 is a block diagram of an example memory device.

Techniques are provided for fabricating a memory device such as a 3D stacked non-volatile memory device with improved program speed uniformity and reduced read disturb. A corresponding memory device is also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory strings extend in memory holes which are formed in the stack.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 11A). In a three-bit per cell memory device, there are eight data states including the erased state and seven higher data states referred to as the A, B, C, D, E, F and G data states. In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

However, the programming and erase speed can vary for memory cells of different memory holes based on their distance from the closest local interconnect. The local interconnect is used to introduce an etchant to remove the sacrificial material of the word lines before depositing the metal of the word lines. See FIG. 16B. In particular, in addition to removing the sacrificial material, the etchant removes some of the blocking oxide layer 667 (FIG. 6) of the memory cells. Moreover, the blocking oxide layers which are closest to the interconnect receive the most etching and become the thinnest. A thinner blocking oxide layer results in a faster program or erase speed because the gate-to-channel distance decreases. With a given gate-to-channel voltage such as in a programming operation, the electric field strength is larger when the distance is smaller. Thus, the thickness Th (FIG. 6, 10B) of the blocking oxide layers, which may comprise $SiO_2$, varies for memory holes based on their distance from the closest interconnect. This results in reduced performance as seen by increased programming time, Vth distribution widths, program disturb and read disturb.

Techniques provided herein address the above and other issues. In one aspect, a memory device is provided in which the channel layers of the memory strings which are relatively close to a local interconnect or other isolation region are doped. These are memory strings in edge regions of a stack. The channel layers of the memory strings which are relatively far from a local interconnect or other isolation region are undoped, in one approach, or doped to a lesser degree than the memory strings in the edge regions. The doping lowers the intrinsic or neutral threshold voltage of the cells in the edge regions, effectively lowering the program speed of these cells and making their speed more uniform with the cells which are relatively far from the local interconnect or other isolation region. This has advantages such as reducing read disturb.

The doping can be performing is different ways. The interior region of memory holes which is relatively far from the local interconnect are masked so that these memory holes are not doped by the doping process. In one possible approach, the memory holes in the edge regions can be exposed to a carrier gas enriched with an n-type dopant such as antimony, arsenic or phosphorus. The n-type doping makes the channel layers more conductive. A heating step may also be used to enhance the diffusion of the dopant into the channel layers. The channel layers are exposed to the gas and become doped. In another possible approach, doped spin on glass is deposited on the stack and a heating step causes the dopants to diffuse into the channel layer. In another possible approach, plasma doping is used. Other approaches are possible as well.

In another approach, the channel layer is deposited separately for the interior region and the edge regions. A doped channel layer material is deposited into the memory holes of the edge regions while the interior region is masked, and an undoped channel layer material is deposited into the memory holes of the interior regions while the edge regions are masked. The channel material may comprise silicon. The above techniques can be used in combination as well.

The techniques are expected to become more important as memory devices are further scaled down. To perform the scale down, the number of local interconnects is reduced and the number of memory holes between local interconnects is increased. This means larger areas of sacrificial material need to be etched away and replaced (e.g., by tungsten) between every two neighboring local interconnects. The duration of the etching process will therefore increase, resulting in a large difference in block oxide thickness for the different memory holes based on their distance from the closest local interconnect.

The techniques allow for a simplified fabrication in which the memory holes in a block have equal widths, in one approach. Also, programming parameters such as initial program voltage and step size can be equal for a block.

These and other features are discussed herein.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain-end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122*d*.

The storage device comprises code such as a set of instructions, and the processor is operable to execute the set of instructions to provide the functionality described herein. Alternatively or additionally, the processor can access code from a storage device 126*a* of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
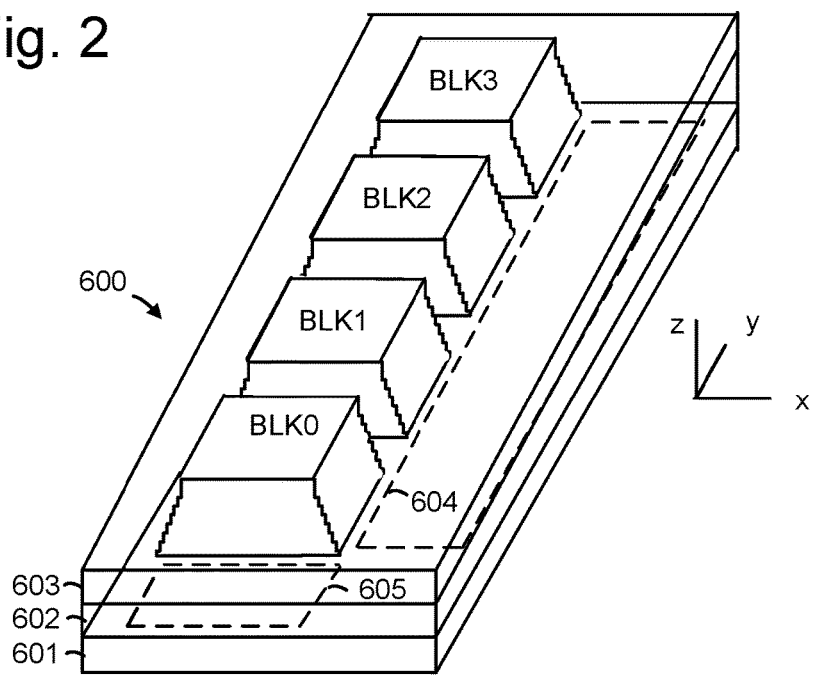
FIG. 2 is a perspective view of a memory device 600 comprising a set of blocks in a plane in an example 3D configuration of the memory structure 126 of FIG. 1.

FIG. 2 is a perspective view of a memory device 600 comprising a set of blocks in a plane in an example 3D configuration of the memory structure 126 of FIG. 1. On the substrate 601 are example blocks BLK0, BLK1, BLK2 and BLK3 of memory cells (storage elements) and peripheral areas with circuitry for use by the blocks. The peripheral area 604 runs along an edge of each block while the peripheral area 605 is at an end of the set of blocks. Voltage detectors for bit lines may be located in this peripheral area 605, in one approach. In this case, the blocks BLK0, BLK1, BLK2 and BLK3 are at progressively further distances from the voltage detectors.

The circuitry can include voltage drivers which can be connected to control gate layers, bit lines and source lines of the blocks. In one approach, control gate layers at a common height in the blocks are commonly driven. The substrate can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions. Typically, the length of the blocks is much longer in the x-direction than the width in the y-direction.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes, as depicted in FIG. 3.

Figure 3:
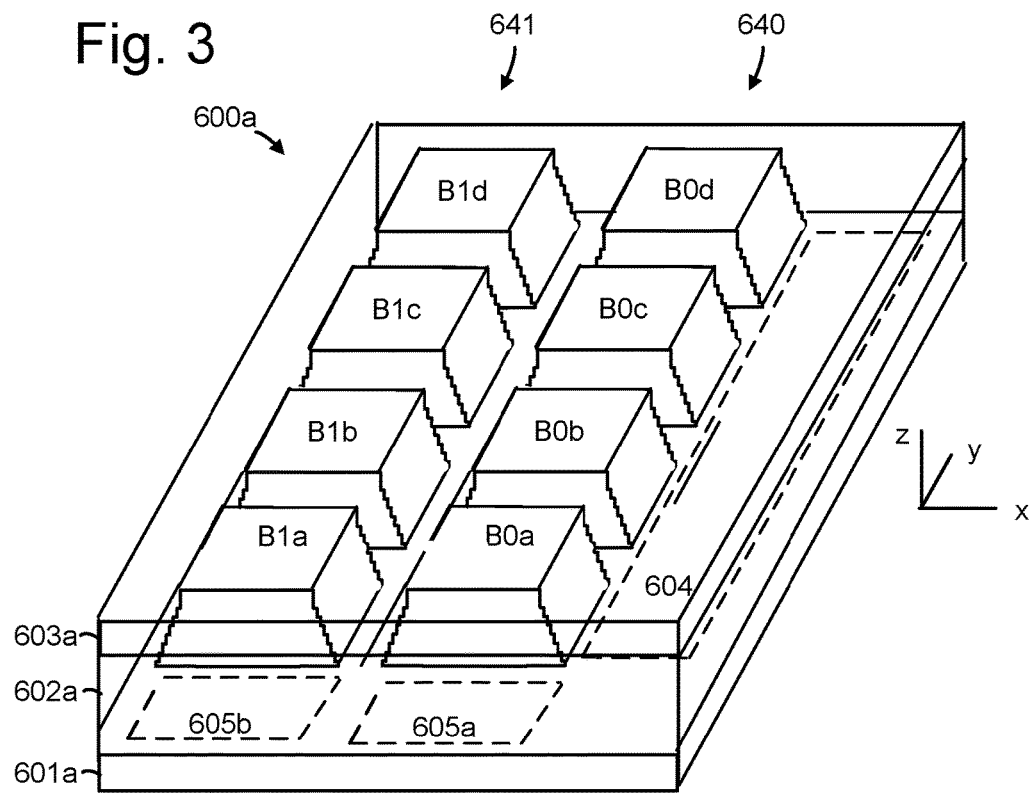
FIG. 3 is a perspective view of a memory device 600a comprising sets of blocks in two planes in another example 3D configuration of the memory device of FIG. 1.

FIG. 3 is a perspective view of a memory device 600a comprising sets of blocks in two planes in another example 3D configuration of the memory device of FIG. 1. Sets of blocks 640 and 641 are formed on two planes on a substrate 601a. A plane is typically defined as a region of a substrate which includes a number of blocks of memory cells and associated row and column control circuitry. The blocks of a plane may be formed on a common p-well, in one approach. The blocks are formed in an intermediate region 602a of the memory device. The set of blocks 640 includes blocks B0a, B0b, B0c and B0d. The set 641 includes blocks B1a, B1b, B1c and B1d. A peripheral area 604a of the substrate includes circuitry for use by both sets of blocks. Peripheral areas 605a and 605b can include circuitry for use by the sets of blocks 640 and 641, respectively.

FIG. 4 depicts an example cross-sectional view of a portion of one of the blocks of FIG. 2 or 3. The block comprises a stack 610 of alternating conductive and dielectric layers. The block comprises conductive layers spaced apart vertically, and the conductive layers comprise word lines connected to the memory cells and select gate lines connected to SGD and SGS transistors.

In this example, the conductive layers or plates comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 or the plurality of word line layers and a drain-end 615 at a top 616a of the stack or the plurality of word line layers. Local interconnects, such as interconnect 617, may be provided periodically across the stack. The local interconnects may be metal-filled slits which extend through the stack, such as to connect the source line/substrate to a line above the stack. The metal 617*d* is isolated from the word line layers by an insulating material 617*c*. The slits may be used during the formation of the word lines and subsequently filled with metal. Specifically, a stack may be formed with a sacrificial material such as SiN for the word lines layers alternating with dielectric layers such as oxide. Slits are etched periodically in the stack down to the substrate, thereby exposing portions of the sacrificial material. An etchant such as hot phosphoric acid is deposited in the slits to remove the sacrificial material, forming voids. A metal is then deposited in the voids via the slits, thus forming the final word line layers. Subsequently, the metal in the slits is cleaned away and the insulating material 617*c* is deposited along the sidewalls of the slits. A hole is etched in the bottom of the insulation layer. The remainder of the slits is filled with the metal 617*d* which extends through the hole to the substrate and up to the top of the stack, thus forming a conductive path or local interconnect from the bottom to the top of the stack A portion of a bit line BL0 is also depicted. A conductive via connects the drain-end of each memory string to a bit line. For example, a conductive via 621 connects the drain-end 615 to BL0. The local interconnect 617 has a top 617*a* and a bottom 617*b*. The bottom is etched through to provide a contact to the substrate.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

This example includes two SGD transistors, two drain side dummy memory cells, two source side dummy memory cells and two SGS transistors in each string, as an example. Generally, the use of dummy memory cells is optional and one or more may be provided. Also, one or more SGD transistors and one or more SGS transistors may be provided in a memory string.

Figure 8B:
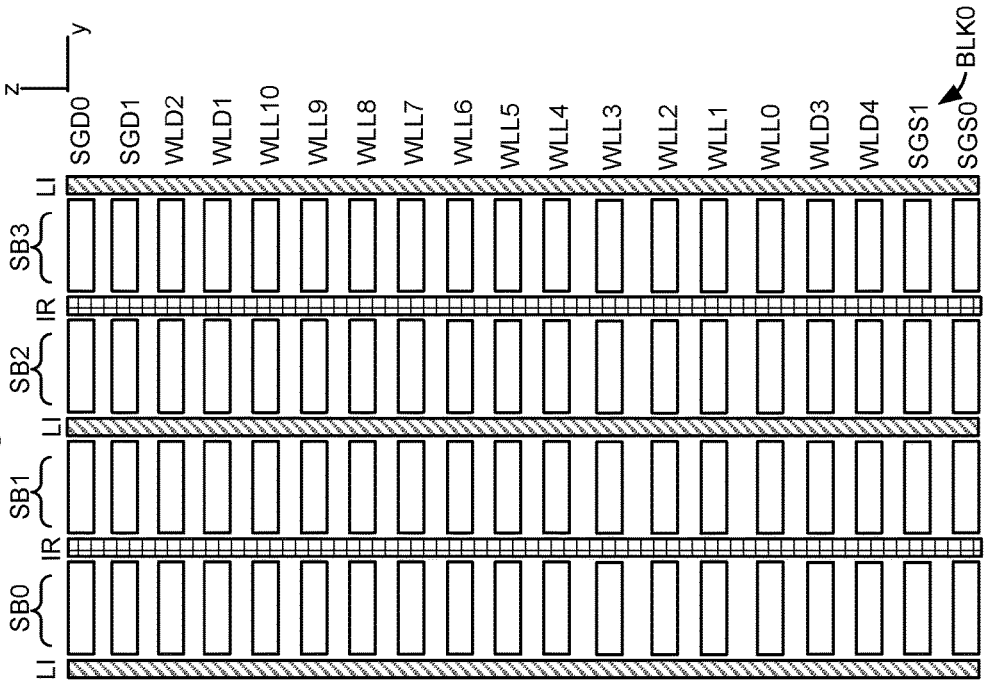
FIG. 8B depicts an example cross-sectional view of a block BLK0 of memory cells where separate word line layers are provided for each of four sub-blocks.

An isolation region IR may be provided to separate portions of the SGD layers from one another to provide one independently driven SGD line per sub-block. In one example, the word line layers are common to two adjacent sub-blocks. See FIG. 8A. In another possible implementation, the isolation region extends down to the substrate to separate the word line layers. See FIG. 8B. In this case, the word line layers are separate in each sub-block. Although, in either case, the word line layers of a block can be joined at their ends to one another so that they are commonly driven within a block, as depicted in FIG. 9. The isolation region comprises an insulating material such as oxide.

FIG. 5 depicts an example transistor 500. The transistor comprises a control gate CG, a drain D, a source S and a channel CH. During a programming operation, the transistor has a positive gate-to-channel voltage. During an erase operation, the transistor has a positive channel-to-gate voltage.

Figure 6:
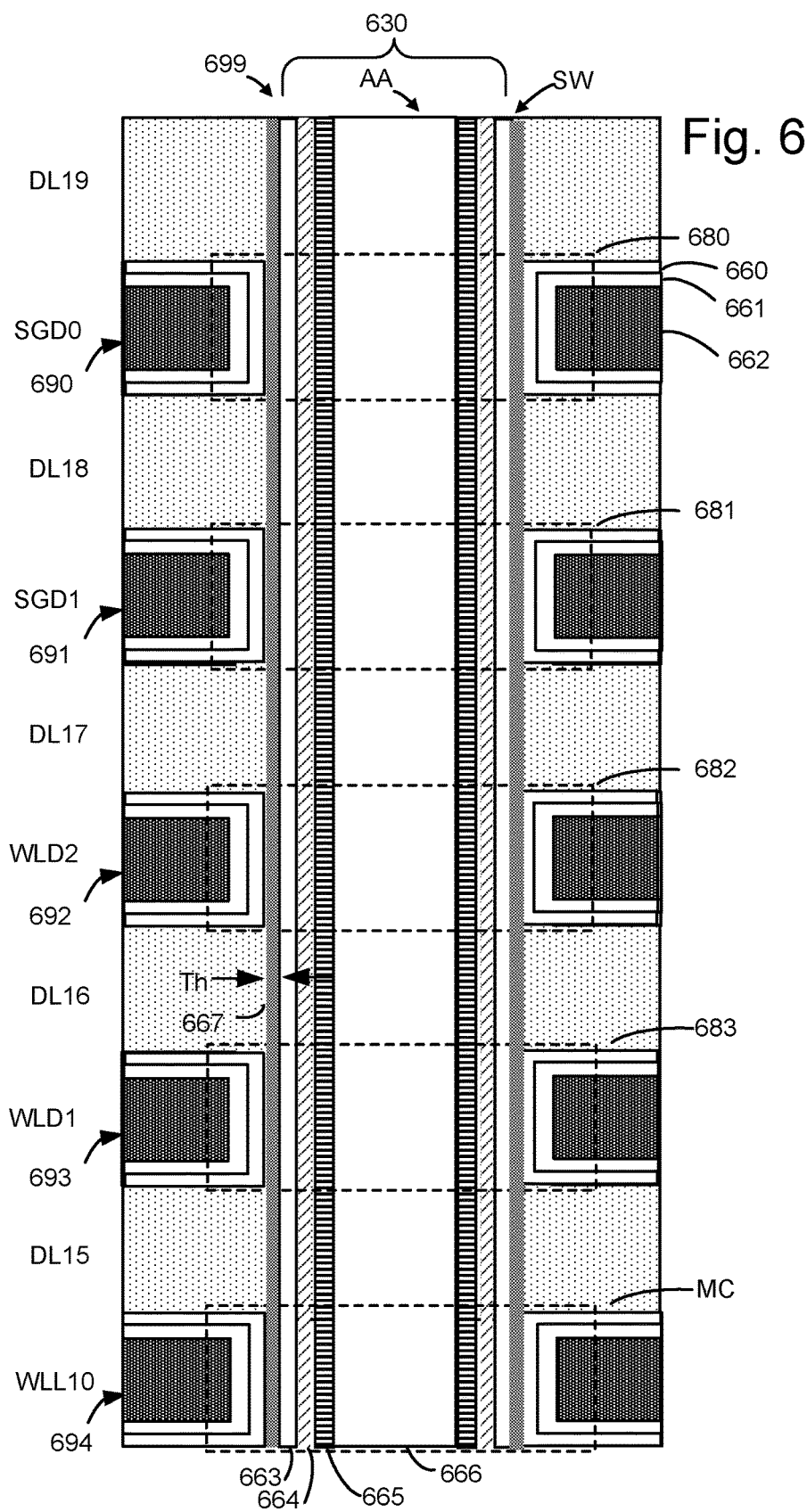
FIG. 6 depicts a close-up view of the region 622 of the stack of FIG. 4.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a blocking oxide 667, a charge-trapping layer 663 or film such as silicon nitride ($Si_3N_4$) or other nitride, a tunneling layer 664 (such as oxide), a channel 665 (e.g., comprising polysilicon), and a dielectric core 666. A word line layer can include a block high-k material 660, a metal barrier 661, and a conductive metal 662 such as Tungsten as a control gate. For example, control gates 690, 691, 692, 693 and 694 are provided. Additional pillars are similarly formed in the different memory holes. A pillar can form a columnar active area (AA) of a NAND string.

The blocking oxide layer 667 has a thickness Th. As mentioned, this thickness can vary for different memory holes based on their distance from the closest local interconnect which is used to introduce an etchant to remove the sacrificial material of the word lines. In particular, the sacrificial material surrounding the outer or edge regions of memory holes (memory holes which are closer to the local interconnect or the edge of the word line layers) will be etched earlier by the etchant which is introduced via vertically etched-through slits, while the sacrificial material surrounding the inner or interior regions of memory holes (memory holes which are further from the local interconnect or the edge of the word line layers) will be etched later. The blocking oxide layer or other dielectric layer in the edge regions of memory holes will be exposed to the etchant for longer time. Due to this exposure, the blocking oxide layer inside the edge regions of memory holes will be etched away more than in the interior region memory holes. This results in different programming speeds, as mentioned. If the edge and the interior regions of memory holes are in a same sub-block, when a selected word line in the sub-block is programmed, the program speed difference between fast and slow cells will be large. This program speed difference within the same word line will require more program verify tests during the program process and therefore increase the total programming time.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

In the example of FIG. 6, the SGD transistors are formed at the same time as the memory cells and share the memory films. In another possible approach, the SGD transistors are formed after the memory cells are formed and do not include the memory films. In this case, the SGD transistors may be doped to provide a desired Vth level without the use of memory films. In one embodiment, the memory holes are formed and filled in, after which the SGD layers are deposited and etched through to form a conductive path to a top of the memory hole.

Figure 7:
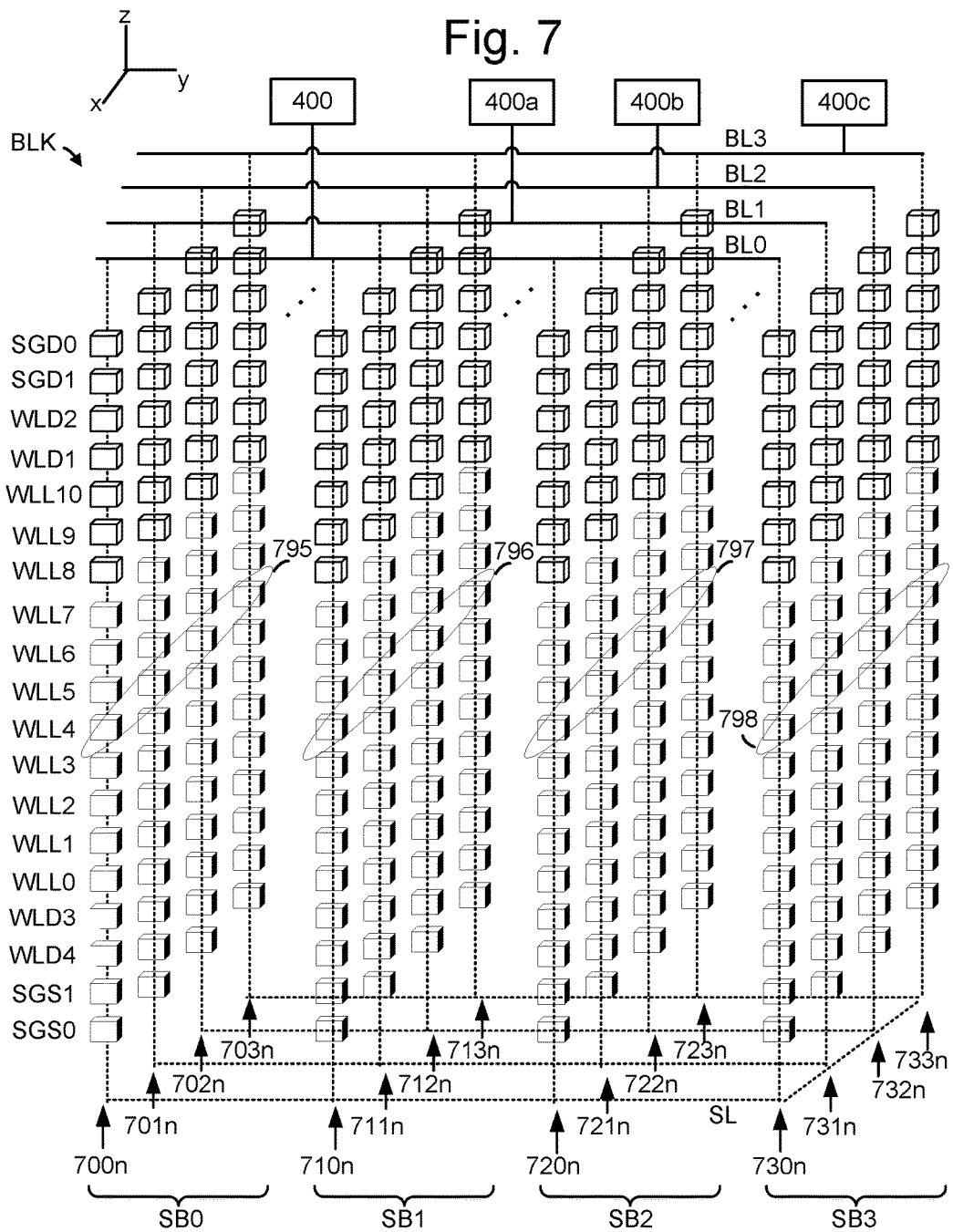
FIG. 7 depicts example sub-blocks SB0-SB3 in one of the blocks of FIG. 2 or 3.

FIG. 7 depicts example sub-blocks SB0-SB3 in one of the blocks of FIG. 2 or 3. A sub-block is a portion of a block and represents a set of memory strings which are programmed together and which have a common SGD line. Also, each memory string in a sub-block is connected to a different bit line, in one approach.

Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. A sense circuit may be connected to each bit line. For example, sense circuits 400, 400a, 400b and 400c are connected to bit lines BL0, BL1, BL2 and BL3, respectively. The NAND strings are examples of vertical memory strings which extend upward from a substrate.

Programming and reading can occur for selected cells in one word line and one sub-block at a time. This allows each selected cell to be controlled by a respective bit line and/or source line. For example, an example set 795 of memory cells in SB0 is connected to WLL4. Similarly, the sets 796, 797 and 798 comprise data memory cells in SB1, SB2 and SB3 are connected to WLL4.

Figure 8A:
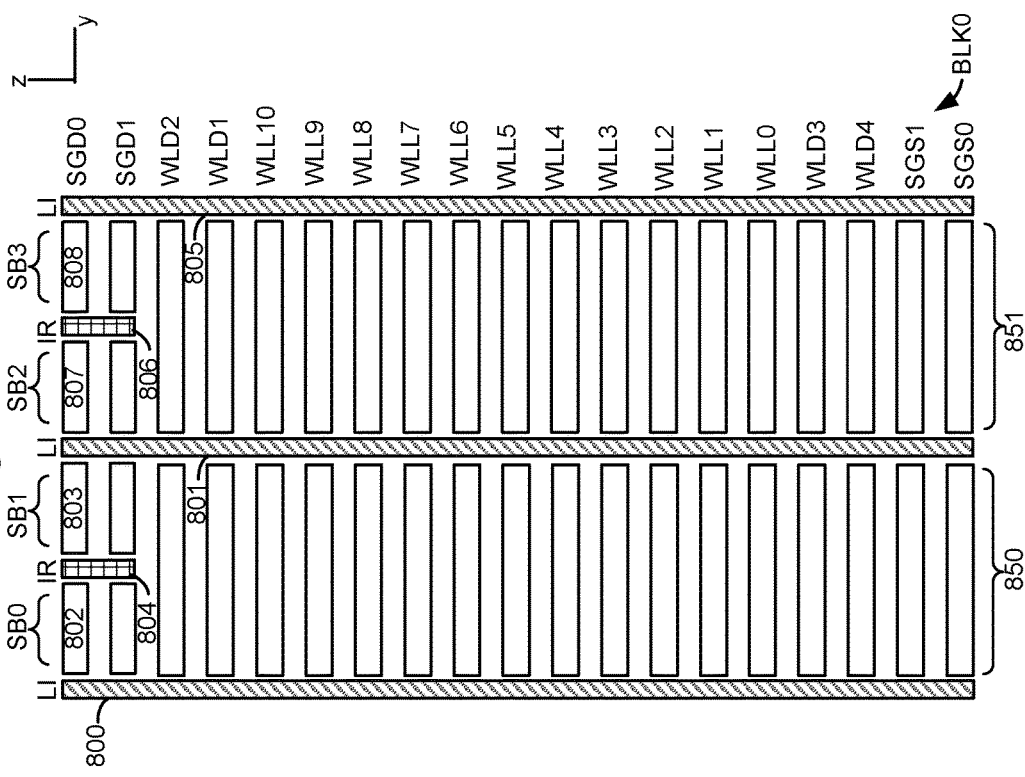
FIG. 8A depicts an example cross-sectional view of a block BLK0 of memory cells where word line layers are shared among two sub-blocks.
Figure 9:
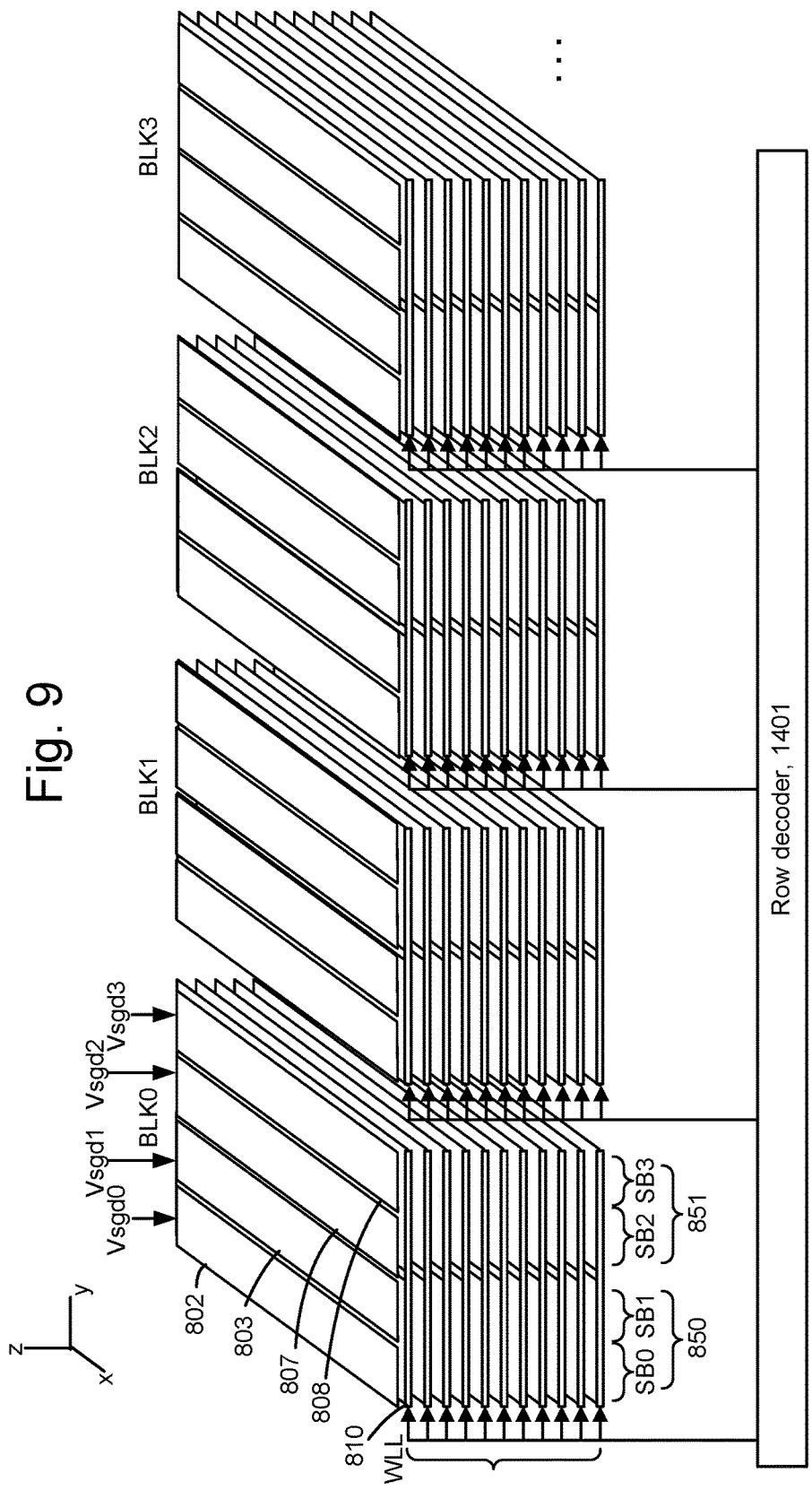
FIG. 9 depicts a perspective view of a set of blocks consistent with FIG. 8A.

FIG. 8A depicts an example cross-sectional view of a block BLK0 of memory cells where word line layers are shared among two sub-blocks. Region 850 of the stack comprises a plurality of word lines layers spaced apart vertically, and is between local interconnects (LI) 800 and 801. This region includes sub-blocks SB0 and SB1. These sub-blocks each have a separate SGD layer 802 and 803 separated by an isolation region (IR) 804 (or SGD cut). Similarly, region 851 of the stack comprises a plurality of word lines layers spaced apart vertically, and is between local interconnects (LI) 801 and 805. This region includes sub-blocks SB2 and SB3. These sub-blocks each have a separate SGD layer 807 and 808 separated by an IR 806.

One set of word line layers is shared among SB0 and SB1, and another set of word line layers is shared among SB2 and SB3. The local interconnects are provided on both sides of the block and in the middle of the block, between SB1 and SB2, in this example. The isolation regions, discussed in connection with FIG. 4, provide separate SGD layers for each sub-block. The widths of the word line layers are uniform within each region 850 and 851, in this example. Further, the widths of the word line layers in region 850 may be the same as in region 851.

Generally, a block can comprise one or more regions of word line layers between two or more local interconnects. Note that a metal interconnect can be replaced by an isolation region (e.g., insulation such as oxide with no metal) if it is not desired to have a conductive path through the stack.

FIG. 8B depicts an example cross-sectional view of a block BLK0 of memory cells where separate word line layers are provided for each of four sub-blocks. Here, the IR extends down through the stack so that the word line layers are separated in each sub-block. Although, in FIGS. 8A and 8B, the word line layers may be joined at an end region so they can be commonly driven in a block. See FIG. 9. The widths are uniform within each sub-block for all of the word line layers, in this example.

FIG. 9 depicts a perspective view of a set of blocks consistent with FIG. 8A. Blocks BLK0, BLK1, BLK2 and BLK2 are depicted. The regions 850 and 851 as discussed in connection with FIG. 8A are depicted. The word line layers (WLL) in each block are depicted along with example SGD lines. One SGD line or layer is provided in each sub-block in this example. BLK0 includes sub-blocks SB0, SB1, SB2 and SB3. The sub-blocks are elongated in the x direction and contain thousands of memory strings in practice. Additionally, many more blocks beyond those depicted are arranged in a row on the substrate in the y-direction. The word line layers and SGD/SGS layers may receive voltages from a row decoder 1901. See also FIG. 19. Each SGD layer can receive a separate voltage from the row decoder. For example, SGD layers 802, 803, 807 and 808 may receive voltages Vsgd0, Vsgd1, Vsgd2 and Vsgd3, respectively. During programming of a block, the memory cells of one word line layer and one sub-block are programmed at a time. Thus, memory cells of WLL0 in SB0 are programmed, followed by memory cells of WLL1 in SB0 and so forth until memory cells of all word line layers in SB0 are programmed. Next, memory cells of WLL0 in SB2, followed by memory cells of WLL1 in SB2 and so forth. The programming can then proceed to the next sub-block if necessary.

Figure 10A:
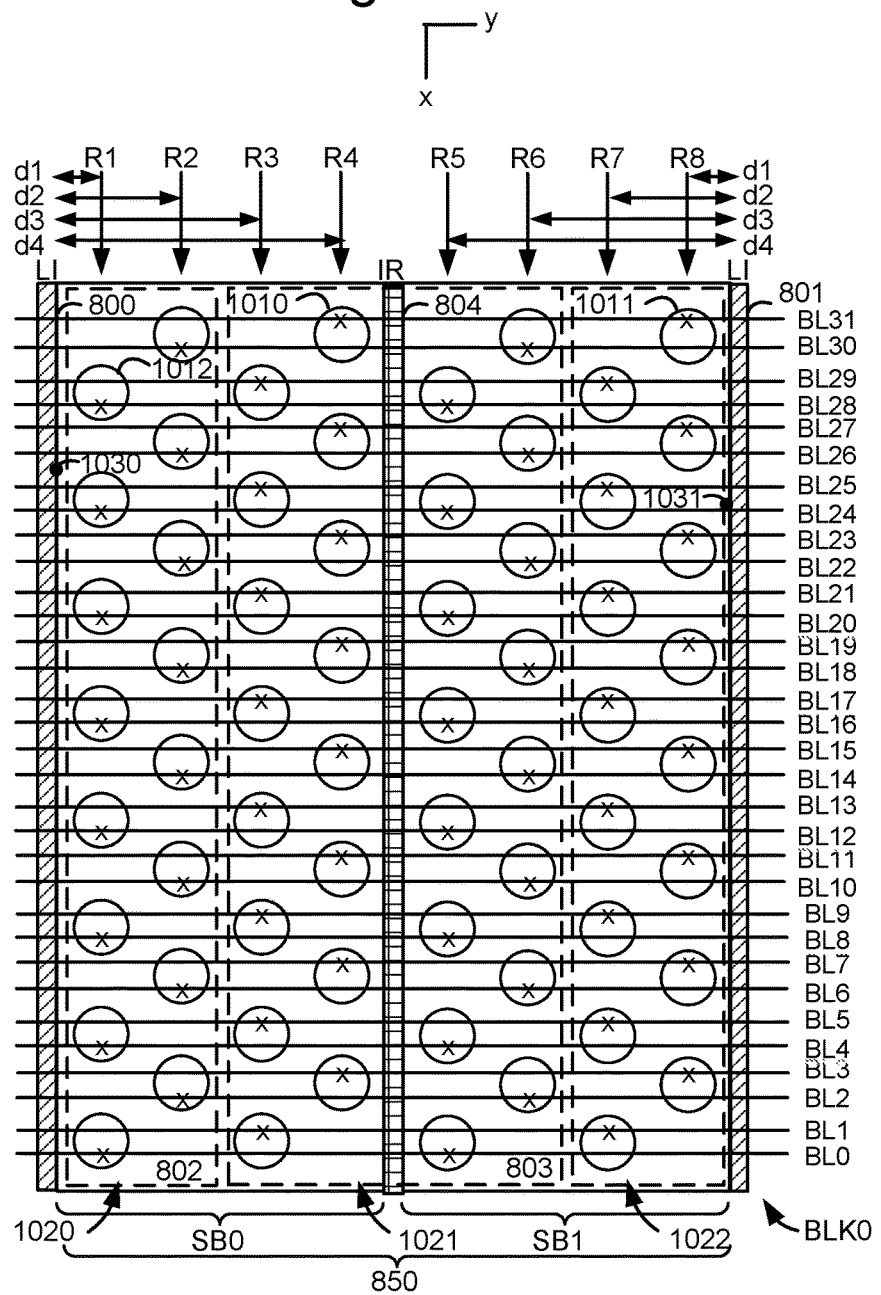
FIG. 10A depicts an example top view of memory holes and the SGD layers 802 and 803 of the region 850 of the block BLK0 of FIG. 8A, where the memory holes are in an interior region 1021 of the stack and in first and second edge regions 1020 and 1022, respectively, of the stack.
Figure 10B:
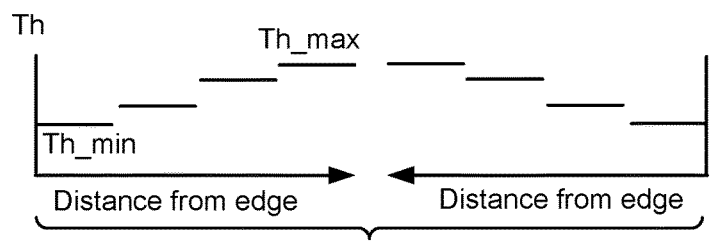
FIG. 10B is a plot showing a variation in the thickness of a blocking oxide layer 667 of FIG. 6 of a memory hole based on a distance of the memory hole from a local interconnect.
Figure 10C:
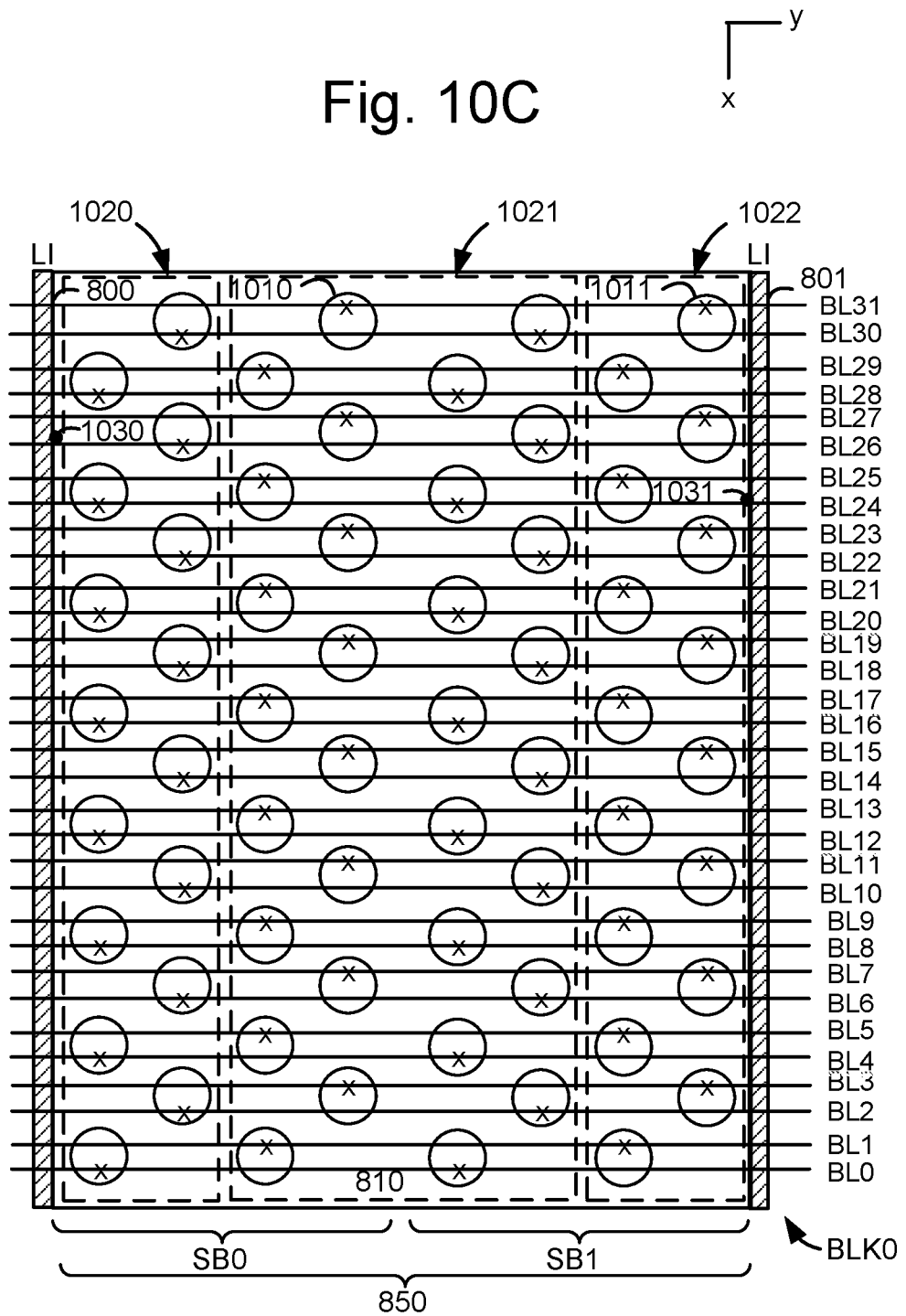
FIG. 10C depicts an example top view of memory holes and the word line layer 810 of the region 850 of the block BLK0 of FIGS. 8A and 10A, including the interior region 1021 of the stack and the first and second edge regions 1020 and 1022, respectively, of the stack.
Figure 10D:
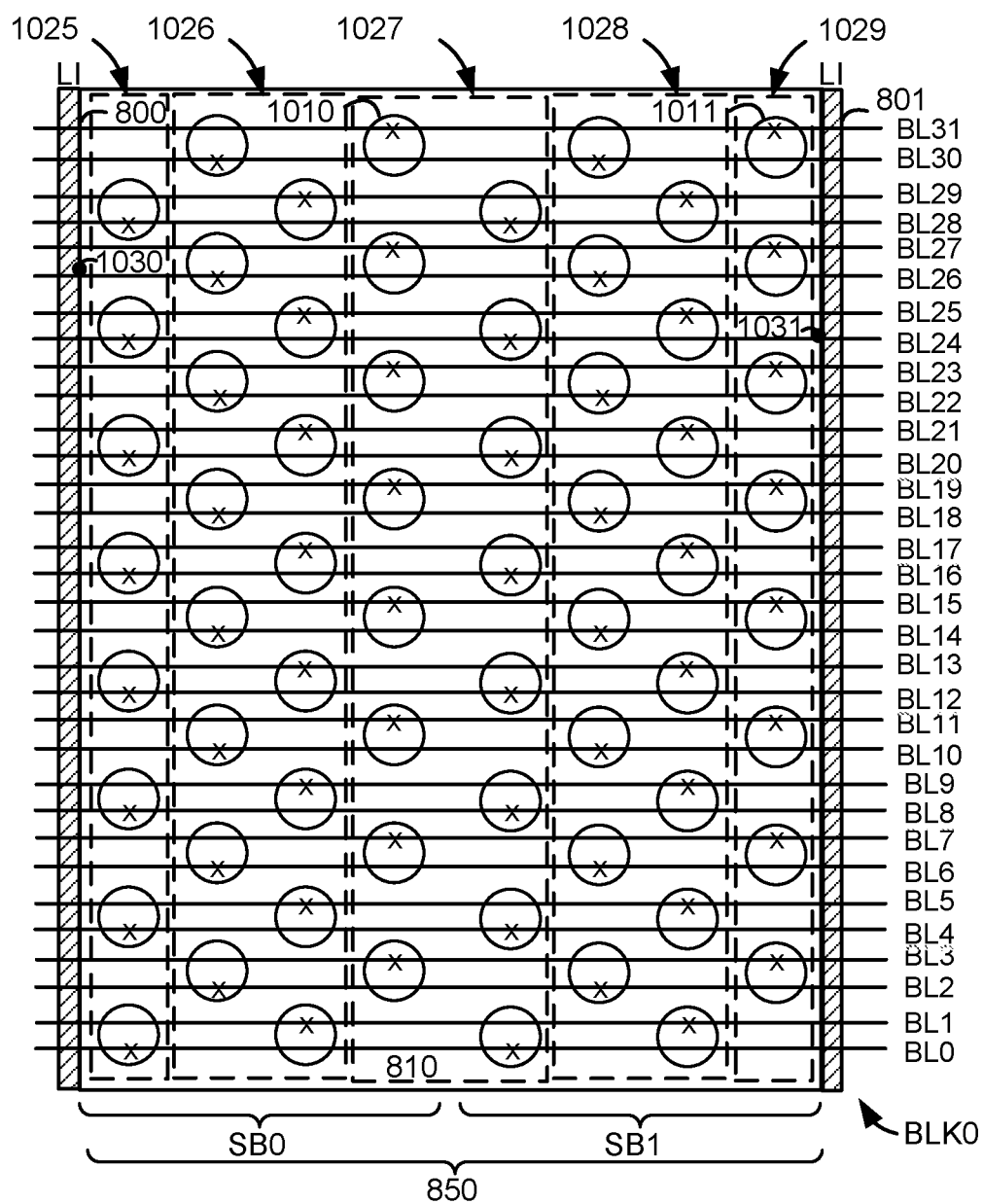
FIG. 10D depicts another example top view of memory holes and the word line layer 810 of the region 850 of the block BLK0 of FIG. 8A, where the memory holes are in an interior region 1027, first and second intermediate regions 1026 and 1028, respectively, and first and second edge regions 1025 and 1029, respectively, of a stack.

In FIGS. 10A, 10C and 10D, each circle represents the cross-section of a memory hole or string. Or, if the memory hole does not extend up to the SGD layers, each circle in FIG. 10A represents the cross-section of a memory hole at a word line layer which is below the select gate layer. A number of bit lines extend above the memory holes and are connected to the memory holes as indicated by the "X" symbols. In these examples, there are 31 bit lines labelled as BL0-BL31. Each bit line is connected to one memory hole or string in each sub-block.

FIG. 10A depicts an example top view of memory holes and the SGD layers 802 and 803 of the region 850 of the block BLK0 of FIG. 8A, where the memory holes are in an interior region 1021 (e.g., central region) of the stack and in first and second edge regions 1020 and 1022, respectively, of the stack. SB0 in region 850 extends between the local interconnect 800 and the isolation region 804. SB1 in region 850 extends between the isolation region 804 and the local interconnect 801.

As mentioned, each bit line is connected to one memory hole or string in each sub-block. For example, BL31 is connected to memory holes or strings 1010 and 1011 in SB0 and SB1, respectively. Also, the memory strings are arranged in rows R1-R8 which extend in the x-direction, and adjacent rows are staggered to improve the memory hole density.

The distance of each row of memory strings from the closest local interconnect is depicted. For example, R1, R2, R3 and R4 are at progressive increasing distances of d1, d2, d3 and d4, respectively, from the LI 800 (and from the edge 1030 of the SGD layer 802 of the stack, which is also an edge of the region 850 of the stack) and R8, R7, R6 and R5 are at progressive increasing distances of d1, d2, d3 and d4, respectively, from the LI 801 (and from the edge 1031 of the SGD layer 803 of the stack, which is also an edge of the region 850 of the stack). In other words, R1, R2, R3 and R4 are at progressive increasing distances from the edge 1030 and R8, R7, R6 and R5 are at progressive increasing distances from the edge 1031. As mentioned, the blocking oxide layers of the memory strings of each row are progressively thicker as the distance from the closest local interconnect is progressively larger, as shown by FIG. 10B. This is because of the movement of the etchant past the closer memory strings to reach the further memory strings. Note that the IR of the SGD cut is typically not used to provide etchant to remove the scarified material of the control gate layers so that the proximity of a memory hole to this IR region generally does not affect the thickness of its blocking oxide layer.

The memory holes are in a first edge region 1020 of the stack (e.g., memory hole 1012), a second edge region 1022 (e.g., memory hole 1011) of the stack and an interior region 1021 of the stack (e.g., memory hole 1010) which is between the first and second edge regions.

While FIG. 10A depicts eight rows of memory holes between adjacent local interconnects, this is an example. Future devices may have more rows, such as sixteen rows. Moreover, the edge regions have the same number of rows in this example but it is also possible that they have different numbers of rows. For example, the edge row of memory holes on one side of a region may be further from the closest LI than the edge row of memory holes on the opposite side of the region is to its closest LI. In this case, the edge row of memory holes on the one side might be in a region by itself while two edges rows of memory holes on the opposite side are in another edge region. For similar reasons, the midpoint of the interior region may not be exactly at the midpoint or center of the corresponding region of the stack.

FIG. 10A provides an apparatus comprising one row of memory strings (R1, R2) which extend through a plurality of word line layers, wherein the plurality of word line layers are vertically spaced apart from one another by dielectric layers, the one row of memory strings is at one distance (d1, d2) from a first edge 1030 of the plurality of word line layers; another row of memory strings (R3, R4) which extend through the plurality of word line layers, the another row of memory strings is at another distance (d3, d4), greater than the one distance, from the first edge of the plurality of word line layers. The one row of memory strings comprises channel layers; the another row of memory strings comprising channel layers; and a doping concentration of the channel layers of the one row of memory strings is greater than a doping concentration of the channel layers of the another row of memory strings.

The one row of memory strings may comprise a blocking oxide which is thinner than a blocking oxide of the another row of memory strings. The channel layers of the another row of memory strings may be undoped, and the channel layers of the one row of memory strings may comprise an n-type dopant.

FIG. 10B is a plot showing a variation in the thickness (Th) of a blocking oxide layer 667 of FIG. 6 of a memory hole based on a distance of the memory hole from a local interconnect. The left side of the figure shows the distance from the edge 1030 and the LI 800 and the right side of the figure shows the distance from the edge 1031 and the LI 801. The minimum thickness Th min is seen for the edge regions of memory holes while the maximum thickness Th max is seen for the interior region memory holes. The thickness may be symmetric with respect to the opposing edges of the stack region 850, in one approach.

FIG. 10C depicts an example top view of memory holes and the word line layer 810 of the region 850 of the block BLK0 of FIGS. 8A and 10A, including the interior region 1021 of the stack and the first and second edge regions 1020 and 1022, respectively, of the stack. WLL10 is shown as an example, but the view would be similar in any of the other word line layers WLL0-WLL9 in FIG. 4, for instance, in one approach.

As mentioned, the region between LIs comprises a plurality of word line layers which are vertically spaced apart from one another by dielectric layers. Each word line layer comprises an edge which is adjacent to an LI. For example, WLL10 comprises the edges 1030 and 1031 adjacent to LIs 800 and 801, respectively, as mentioned.

The distance of each row of memory strings from the closest edge of the word line layer, or equally to the closest local interconnect, may be the same as in FIG. 10A. The blocking oxide layers of the memory strings of each row are progressively thicker as the distance from the closest edge is progressively larger.

First and second isolation areas (e.g., 800 and 801) or interconnects are adjacent to the first and second edges (e.g., 1030 and 1031), respectively, and extend at least from a bottom of the plurality of word line layers to a top of the plurality of word line layers. The memory holes are in the first edge region 1020 of the stack, the second edge region 1022 of the stack and the interior region 1021 of the stack, as discussed in connection with FIG. 10A.

Figure 11A:
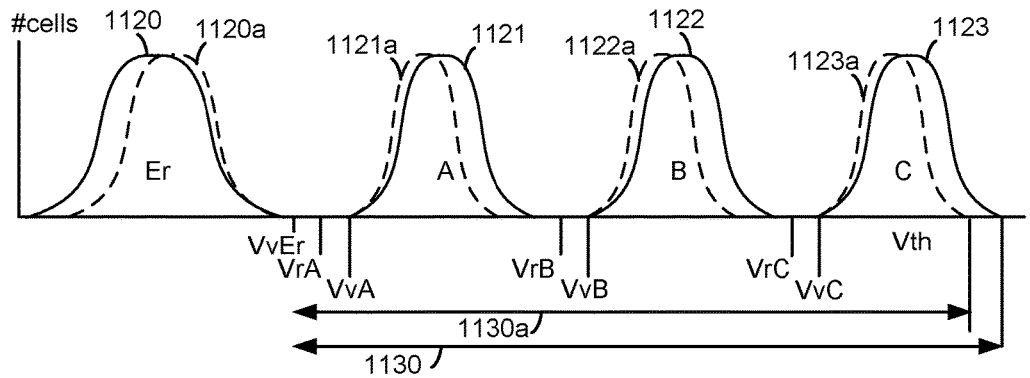
FIG. 11A depicts an example threshold voltage (Vth) distribution of a set of memory cells connected to a word line, showing the effects of programming speed variations in a block, where four data states are used.

FIG. 11A depicts an example threshold voltage (Vth) distribution of a set of memory cells connected to a word line, showing the effects of programming speed variations in a block, where four data states are used. For a set of cells which are programmed together, the Vth distributions 1120, 1121, 1122 and 1123 represent the erased (Er) state and programmed data states A, B and C, respectively, when the cells have significant programming speed variations, and the Vth distributions 1120a, 1121a, 1122a and 1123a represent the erased (Er) state and programmed data states A, B and C, respectively, when the cells have relatively small programming speed variations. In an erase operation, the erased state is reached when the Vth of the cells falls below a verify level VvEr. In a programming operation, the A, B and C states are reached when the Vth of the cells exceeds the verify level VvA, VvB or VvC, respectively. This example uses four data states. Other numbers of data states can be used as well, such as eight or sixteen. Read voltages VrA, VrB and VrC are used to read data from a set of cells having this Vth distribution.

In one approach, the memory cells store separate pages of data. For example, with four bits per cell as in this example, there will be a lower page and an upper page. The lower page is read using VrA and VrC and the upper page is read using VrB. An example encoding of bits for the Er, A, B and C states is 11, 10, 00 and 01, respectively, in the format of upper page (UP) bit/lower page (LP) bit.

When cells of one word line layer have different programming speeds, the number of programming loops can increase. This is due to a large programming swing, which is the difference between the final program voltage and the initial program voltage. For example, the arrows 1130 and 1130a represent the programming swing when the cells have significant programming speed variations or relatively small programming speed variations, respectively. The programming swing is equal to the difference between the upper tail of the erase state Vth distribution (e.g., VvEr) and the upper tail of the Vth distribution of the highest programmed state. The cells having a Vth in the upper tail of the Vth distribution of the C state take the most program loops to program. Further, the number of verify operations for each programmed state is greater when the cells have significant programming speed variations. This also contributes to the increased number of program loops.

This situation results because a set of cells which is programmed together is constrained to use the same initial program voltage and step size. The techniques described herein overcome this problem by doping channel layers of memory cells in selected rows of memory holes to reduce their program speed so that it is similar to the programming speed of remaining memory cells which have undoped channel layers.

Figure 11B:
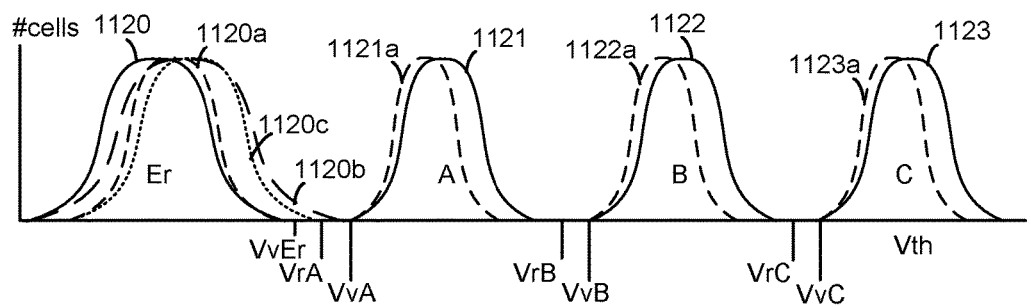
FIG. 11B depicts an example Vth distribution of a set of memory cells connected to a word line, showing the effects of read disturb variations in a block, where four data states are used.

FIG. 11B depicts an example Vth distribution of a set of memory cells connected to a word line, showing the effects of read disturb variations in a block, where four data states are used. Another disadvantage of unequal programming speed is increased read disturb. Read disturb is a form of soft programming and primarily affects the erased state cells. A cell with a faster programming speed will also have a greater read disturb. When a pass voltage of, e.g., 8-10 V is applied to an unselected word line while a selected word line is being read or programmed, the Vth of the erased state cells can increase. Over time, after many read operations are performed, the increase in Vth can be sufficiently high to cause a read error. The erased state cells are initially undisturbed. For example, when there are relatively large programming speed variations, the Vth distributions 1120 and 1120b represent the undisturbed and disturbed erased state cells, respectively. The upper tail of the Vth distribution 1120b exceeds the read voltage VrA, so that read errors can occur for the associated memory cells. When there are relatively small programming speed variations, the Vth distributions 1120a and 1120c represent the undisturbed and disturbed erased state cells, respectively. The upper tail of the Vth distribution 1120b does not exceed the read voltage VrA, so that read errors do not occur for these memory cells.

Some techniques which provide uniform programming speeds still do not reduce read disturb. For example, one approach is to define sub-blocks such that memory cells with a similar programming speed are grouped in one sub-block and can be programmed together. However, different sub-blocks will still have different programming speeds and therefore different levels of read disturb. The worse read disturb in the sub-blocks with a faster programming speed will deteriorate the overall read disturb reliability of a block.

Figure 11C:
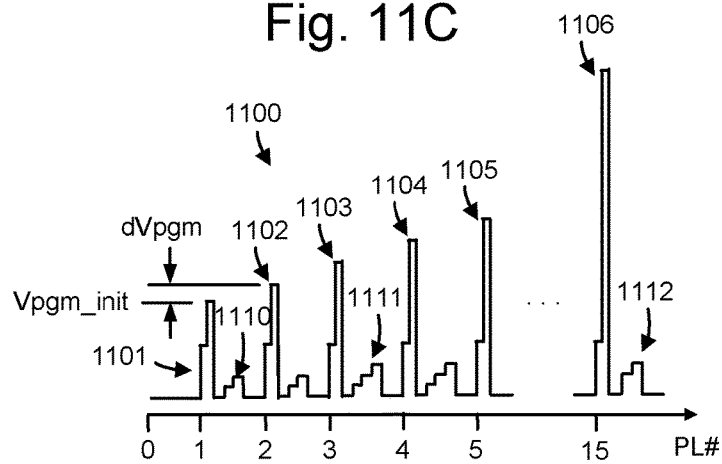
FIG. 11C depicts a waveform of an example programming operation comprising incremental step pulse programming, where Vpgm_init is an initial program voltage and dVpgm is a step size.

FIG. 11C depicts a waveform of an example programming operation comprising incremental step pulse programming (ISPP), where Vpgm_init is an initial program voltage and dVpgm is a step size. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages such as discussed in connection with FIG. 11A.

Each program voltage includes two steps, in one approach. Further, ISPP is used in this example, in which the program voltage steps up in each successive program loop using a fixed or varying step size. This example uses ISPP in a single programming pass in which the programming is completed. ISPP can also be used in each programming pass of a multi-pass operation.

The waveform 1100 includes a series of program voltages 1101, 1102, 1103, 1104, 1105, . . . 1106 that are applied to a word line selected for programming and to an associated set of non-volatile memory cells. The series of program voltages begins with an initial program voltage of Vpgm_init. Each successive program voltage may increase by a step size dVpgm. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 1110) may be applied after each of the program voltages 1101 and 1102. A-, B- and C-state verify voltages of VvA, VvB and VvC (waveform 1111) may be applied after each of the program voltages 1103 and 1104. After additional program loops, B- and C-state verify voltages of VvB and VvC (waveform 1112) may be applied after the final program voltage 1106.

A programming operation can use one or more programming passes. A one pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vpass (e.g., 8-10 V), is applied to the remaining word lines. By testing whether the Vth of a given memory cell is above or below one or more of the read voltages, the system can determine the data state which is represented by a memory cell. These read voltages are demarcation voltages because they demarcate between Vth ranges of different data states.

Figure 12A:
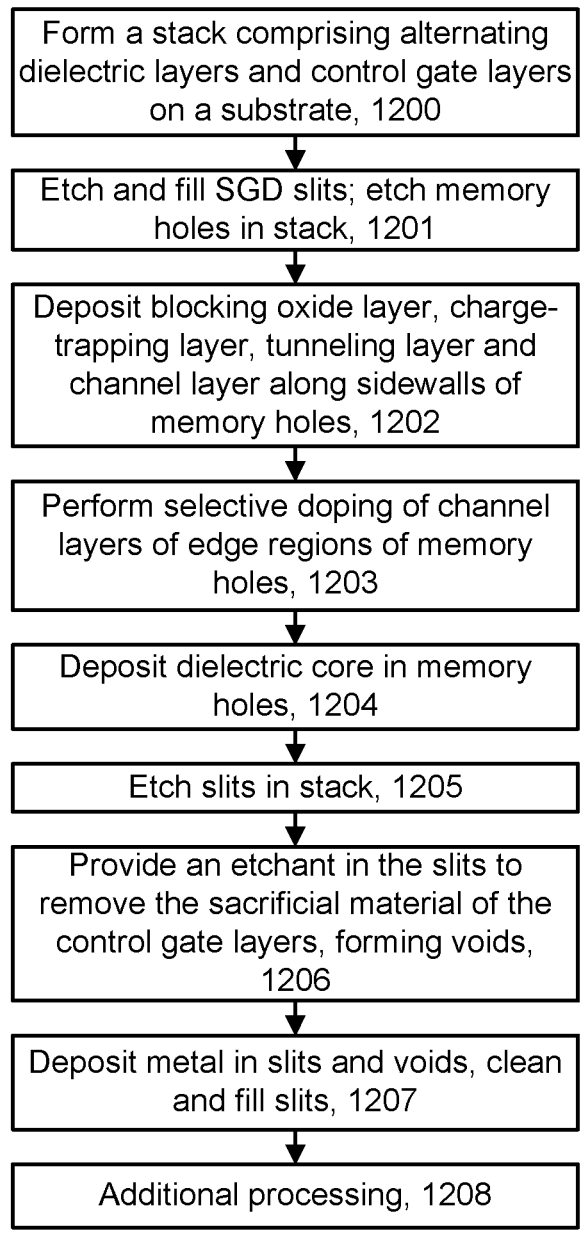
FIG. 12A depicts an example process for forming a memory device in which memory holes in edge regions of a stack have doped channel layers.

FIG. 12A depicts an example process for forming a memory device in which memory holes in edge regions of a stack have doped channel layers. Step 1200 includes forming a stack comprising alternating dielectric layers and control gate layers on a substrate. In one approach, the control gate layers initially comprise a sacrificial material such as $Si_3N_4$. See, e.g., FIG. 13A. Step 1201 includes etching and filling the SGD slits, and etching memory holes in the stack. See, e.g., FIG. 13B. Step 1202 includes depositing, in turn, a blocking oxide layer, a charge-trapping layer, a tunneling layer and a channel layer along the sidewalls of the memory holes. See, e.g., FIGS. 6 and 13B. For example, chemical vapor deposition (CVD) may be used to deposit these layers. In one approach, the channel layer is formed by depositing amorphous silicon and this is converted to poly-silicon through subsequent heating steps. The doped channels may comprise doped polysilicon and the undoped channels may comprise undoped polysilicon.

Step 1203 includes performing selective doping of channel layers of the edge regions of memory holes. This occurs while the channel layers of these memory holes are exposed, e.g., before the memory holes are filled as in step 1204, and while other memory holes are masked. Various options for performing step 1203 include those in FIG. 12B-12D. Step 1204 includes depositing a dielectric core such as SiO2 in each of the memory holes. See FIG. 16A. Step 1205 includes etching slits in the stack. See FIG. 16A. Step 1206 includes providing an etchant in the slit to remove the sacrificial material of the control gate layers, thus forming voids in the control gate layers. See FIG. 16B. The sacrificial material may comprise Si3N4 and the dielectric layers may comprise oxide, for example. The etchant can be a wet or dry etchant which is more selective of the sacrificial material of the control gate layer than of the dielectric layers. Step 1207 includes depositing a metal in the slits and voids, and cleaning and filling the slit. See FIGS. 16C and 16D. Step 1208 includes additional processing such as forming bit line and other structures above the stack.

Note that the steps depicted can be performed in different orders in different implementations. For example, the SGD slits could be formed later in the process.

Figure 12B:
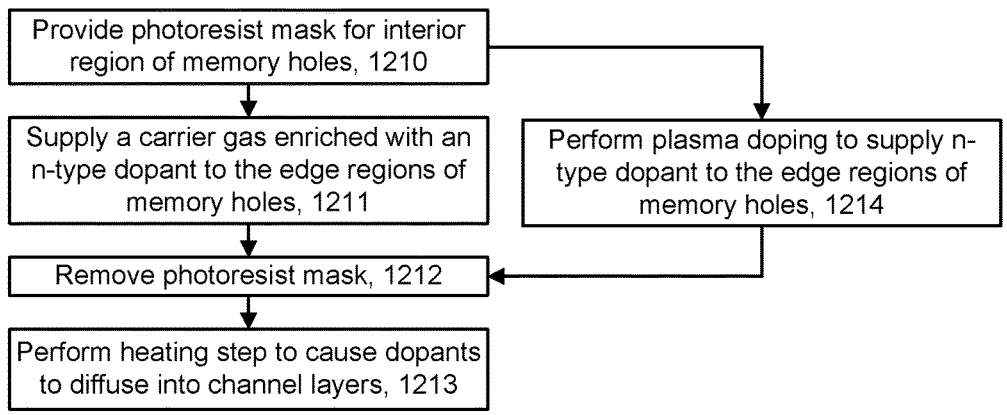
FIG. 12B depicts an example process for implementing the selective doping of step 1203 of FIG. 12A, where the doping is performed using a carrier gas or plasma doping.

FIG. 12B depicts an example process for implementing the selective doping of step 1203 of FIG. 12A, where the doping is performed using a carrier gas or plasma doping. Step 1210 includes providing a photoresist mask for interior region of memory holes. This can include depositing and then patterning the photoresist. For example, the patterning can use reactive ion etching or plasma etching. See FIGS. 13C and 13D1, respectively. Step 1211 includes supplying a carrier gas which is enriched with an n-type dopant to the edge regions of memory holes. See FIG. 14. Example n-type dopants include antimony, arsenic or phosphorus. For example, SbCl3 (antimony trichloride), AsCl3 (arsenic trichloride), and POCL3 (Phosphoryl trichloride) may be used to transport antimony (Sb), arsenic (As) or phosphorus, respectively, in an inert gas such as nitrogen (N2). Step 1212 includes removing the photoresist mask. Step 1213 includes performing a heating step, e.g., furnace heating, to cause dopants to diffuse into the channel layers. The dopants will diffuse into the channel layers when the carrier gas is supplied. The heating step may include a high temperature anneal at 900-1000 C which drives the dopants further into the channel layers.

Note that in this and the other flowcharts, not all necessary steps are shown. Photolithography generally involves a number of steps, including surface preparation, which can include wafer cleaning and priming, coating the wafer with the photoresist such as by spin coating, and a pre-exposure bake (soft bake) which is used to evaporate the coating solvent and to densify the resist after spin coating. Other steps include alignment of the mask to the substrate, exposure of the photoresist, post-exposure bake of the photoresist, and development of the photoresist in which the photoresist is washed in a development solution which removes exposed areas of the photoresist (for a positive photoresist) or unexposed areas of the photoresist (for a negative photoresist). A post-exposure bake may be used to activate a chemically amplified reaction in the exposed area. A post-development hard bake may be used to stabilize and harden the developed photoresist, after which the carrier gas is supplied. Other steps include stripping the photoresist from the substrate and post processing cleaning.

Step 1214 provide one possible alternative to step 1211, and includes performing plasma doping to supply the n-type dopant to the edge regions of the memory holes. See also FIG. 20.

Figure 12C:
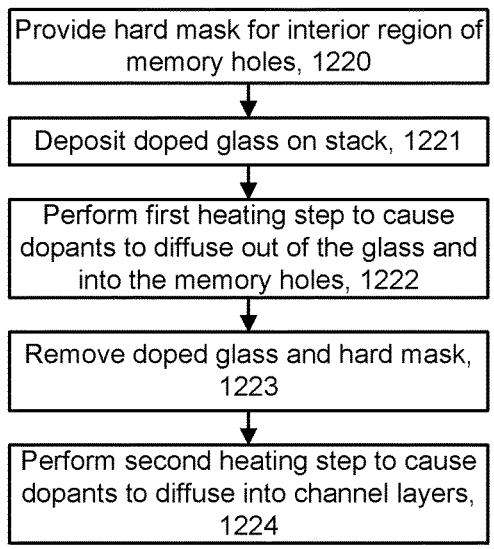
FIG. 12C depicts another example process for implementing the selective doping of step 1203 of FIG. 12A, where the doping is performed using doped spin on glass.

FIG. 12C depicts another example process for implementing the selective doping of step 1203 of FIG. 12A, where the doping is performed using doped spin on glass. Step 1220 includes providing a hard mask for an interior region of memory holes. See FIGS. 13C and 13D1, respectively. A hard mask is a mask that is more resistant than photoresist to etching. The hard mask may be a dielectric material such as silicon nitride (SiN3), silicon dioxide (SiO2), silicon oxynitride (SiON) or tetraethyl orthosilicate (TEOS). Step 1221 includes depositing doped glass on the stack using a spin on technique, for instance. Spin-on glass (SOG) may comprise as a mixture of SiO2 forming chemicals and dopants that are suspended in a solvent solution. The SOG is applied to a silicon wafer by spin-coating. The dopants may comprise at least one of antimony, arsenic or phosphorus, for instance. Step 1222 includes performing a first heating step to cause dopants to diffuse out of the SOF and into the channel layers in the memory holes. In one approach, a lower temperature (compared to that in a second heating step) is used to cause the dopant to leave the spin on glass. This is a pre-deposition step. Dopant from portions of the spin on glass which are directly above the memory holes enters the memory holes. Dopant from portions of the spin on glass which are not directly above the memory holes are generally blocked by a dielectric layer of the stack such as an SiO2 layer. It is possible to provide a hard mask material as the top layer of the stack to provide such blockage. The SiO2 of the alternating dielectric layers of the stack can serve this purpose.

Step 1223 includes removing the doped glass (which has a lower doping concentration after step 1222) such as by using a hydrofluoric acid (HF) solution. Step 1223 also includes subsequently removing the hard mask, e.g., using dry etching such as reactive ion etching or plasma etching. After the glass is removed, the memory holes in the edge regions will be exposed while the hard mask remains over the interior region. When etching such as plasma oxygen etching is performed to remove the hard mask, portions of the doped polysilicon channel layers may be oxidized. This is not problematic as the oxidized regions will be small and the oxidation is compatible with the subsequent step of providing an SiO2 core filler in the memory holes.

Step 1224 includes performing a second heating step to cause the dopants to diffuse into the channel layers in the memory holes. For example, a temperature such as 900-1000 C can be used. This a drive in step. Furnace heating may be used, for instance. Laser heating could be used but could melt the spin on glass and make it harder to remove. The temperature of the second heating step is higher than in the first heating step, in one approach. An alternative to depositing spin on glass can include depositing a doped solid. For example, As2O3 (arsenic trioxide) can be deposited on the stack to provide arsenic dopants or P2O5 (phosphorus pentoxide) can be deposited on the stack to provide phosphorus dopants. The solid is heated to case the dopants to diffuse into the exposed memory holes.

Spin on glass is advantageous because it allows the doping level to be carefully controlled to achieve the desired change in the intrinsic Vth of the cells. Also, uniform doping along the height of the memory hole is facilitated. Further, the glass can be easily removed from the stack and does not leave a residue.

The doping process can be adjusted by experimentation to obtain a desired dopant concentration in the channel layers are a corresponding reduction in the intrinsic or neutral threshold voltage of the cells. The adjusting can include adjusting the concentration of the dopant in the gas, spin on glass or other dopant source, adjusting parameters of the doping, such as duration and energy, and adjusting the heating step or steps, including temperatures and durations at specific temperatures.

Figure 12D:
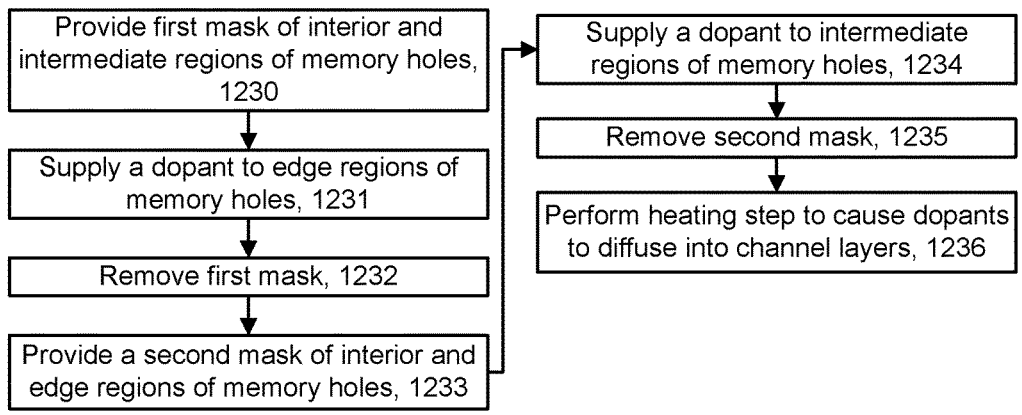
FIG. 12D depicts another example process for implementing the selective doping of step 1203 of FIG. 12A, where the doping is performed separately for edge regions and intermediate regions of memory holes.

FIG. 12D depicts another example process for implementing the selective doping of step 1203 of FIG. 12A, where the doping is performed separately for edge regions and intermediate regions of memory holes. Refer also to FIG. 10D which shows first and second intermediate regions 1026 and 1028. Each intermediate region is between an edge region and an interior or central region of memory holes and memory strings. This approach provides different levels of doping for channel layers based on their distance from a local interconnect. The edge regions receive the highest level of doping and the intermediate regions receive the next highest level of doping. This concept can be extended to more than two levels of doping as well. This concept allows the doping level to be set in a more finer grained manner based on the memory hole position. This will make the pro-am speeds even more uniform across a block.

The interior region may be undoped, in one approach. This may mean that no doping process is performed for the channel layers in the interior region after the channel layer is deposited. It is possible that there is a small naturally occurring amount of dopant in these channel layers.

Step 1230 includes providing a first mask of interior and intermediate regions of memory holes. See FIG. 17A. Step 1231 includes supplying a dopant to edge regions of memory holes. Step 1232 includes removing the first mask. Step 1233 includes providing a second mask of interior and edge regions of memory holes. See FIG. 17B. Step 1234 includes supplying a dopant to the intermediate regions of memory holes. Step 1235 includes removing the second mask. Step 1236 includes performing a heating step to cause the dopants to diffuse into the channel layers. The heating can occur at different times in the process.

Figure 12E:
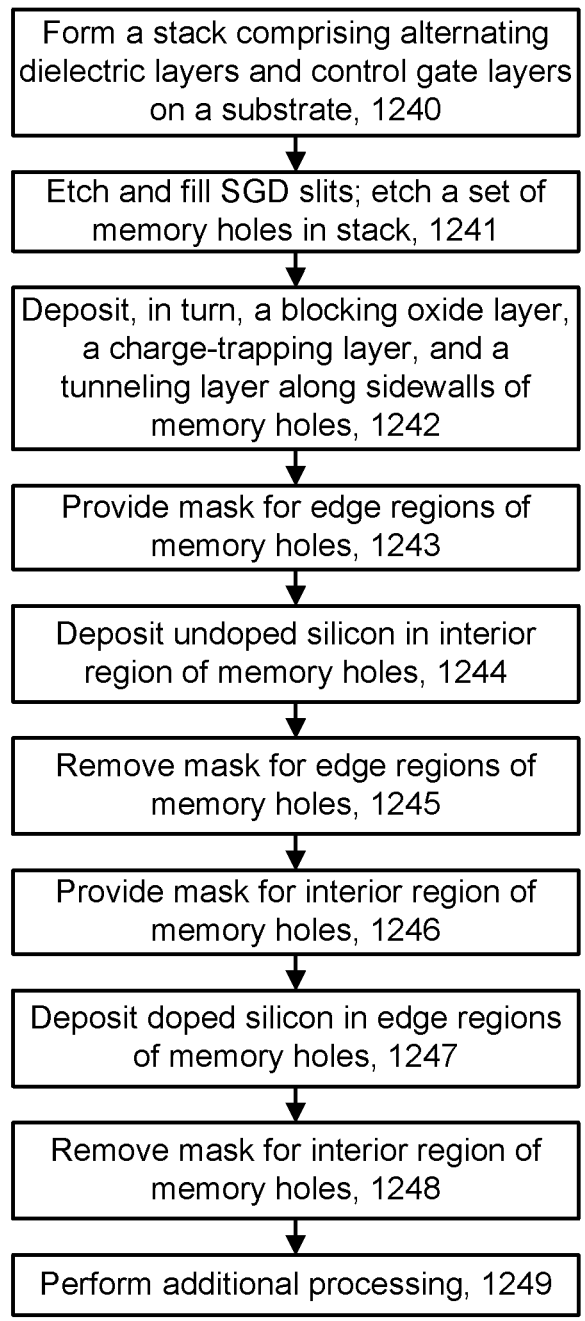
FIG. 12E depicts another example process for forming a memory device in which memory holes in edge regions of a stack have doped channel layers.

FIG. 12E depicts another example process for forming a memory device in which memory holes in edge regions of a stack have doped channel layers. Step 1240 includes forming a stack comprising alternating dielectric layers and control gate layers on a substrate. Step 1241 includes etching and filling the SGD slits, and etching a set of memory holes in the stack. Step 1242 includes depositing, in turn, a blocking oxide layer, a charge-trapping layer, and a tunneling layer along the sidewalls of the set of memory holes. The channel layers are not yet deposited. Step 1243 includes providing a mask, e.g., photoresist, for the edge regions of memory holes. Step 1244 includes depositing undoped silicon in the interior region of memory holes. This undoped silicon forms the channel layers for these memory holes. See FIG. 13D2 and the mask portions 1315b and 1315c. FIG. 13D2 may be modified in that the channel layers are not present in the edge region memory holes.

Step 1245 includes removing the mask for the edge regions of memory holes, e.g., using an appropriate photoresist removal process. Step 1246 includes providing a mask for the interior region of memory holes. Step 1247 includes depositing doped silicon in the edge regions of memory holes. See FIG. 13D1 and the mask 1315a. This doped silicon forms the channel layers for these memory holes. Step 1248 includes removing the mask for the interior region of memory holes. Step 1249 includes performing additional processing such as providing a core dielectric filler in the set of memory holes while the set of memory holes is unmasked.

Note that the order of the steps can be modified so that the silicon is provided for the channel layers of the edge regions before the interior region if desired. A further modification is based on FIG. 12D and involves providing the silicon for the channel layers separately for three (or more) different regions of the stack.

As mentioned, the silicon which is deposited may comprise amorphous silicon or polysilicon, for example. Amorphous silicon may be converted to polysilicon after it is deposited in the memory holes through subsequent heating steps. By depositing the silicon in a doped form, the doping level can be precisely controlled and made more uniform along the height of the memory holes.

In accordance with FIG. 12E, a method for fabricating a memory device comprises: etching a set of memory holes in a plurality of word line layers, the plurality of word line layers are vertically spaced apart from one another by dielectric layers in a stack, the set of memory holes are arranged between first and second isolation regions which extend vertically a height of the stack, the set of memory holes comprises memory holes in a first edge region of the stack adjacent to the first isolation region, a second edge region of the stack adjacent to the second isolation region, and an interior region between the first and second edge regions; depositing, in turn, a blocking oxide layer, a charge trapping layer and a tunneling layer in the set of memory holes; providing an undoped channel layer in the memory holes in the interior region while the memory holes in the first edge region and the memory holes in the second edge region are masked; and providing a doped channel layer in the memory holes in the first edge region and the memory holes in the second edge region while the memory holes in the interior region are masked.

The providing the doped channel layer may comprise providing a carrier gas comprising silicon and an n-type dopant. The method may further include providing a core dielectric filler in the set of memory holes while the set of memory holes is unmasked. The silicon may comprise amorphous silicon or polysilicon.

FIG. 13A depicts an example cross-sectional view of a stack of a memory device during a fabrication process consistent with step 1200 of FIG. 12A, where the stack includes alternating dielectric and control gate layers. The dielectric layers may comprise oxide and the control gate layers may comprise $Si_3N_4$, for example, at this stage. The stack 1300 includes a substrate 611 and an insulating film 612 on the substrate as discussed in connection with FIG. 4.

Figure 13B:
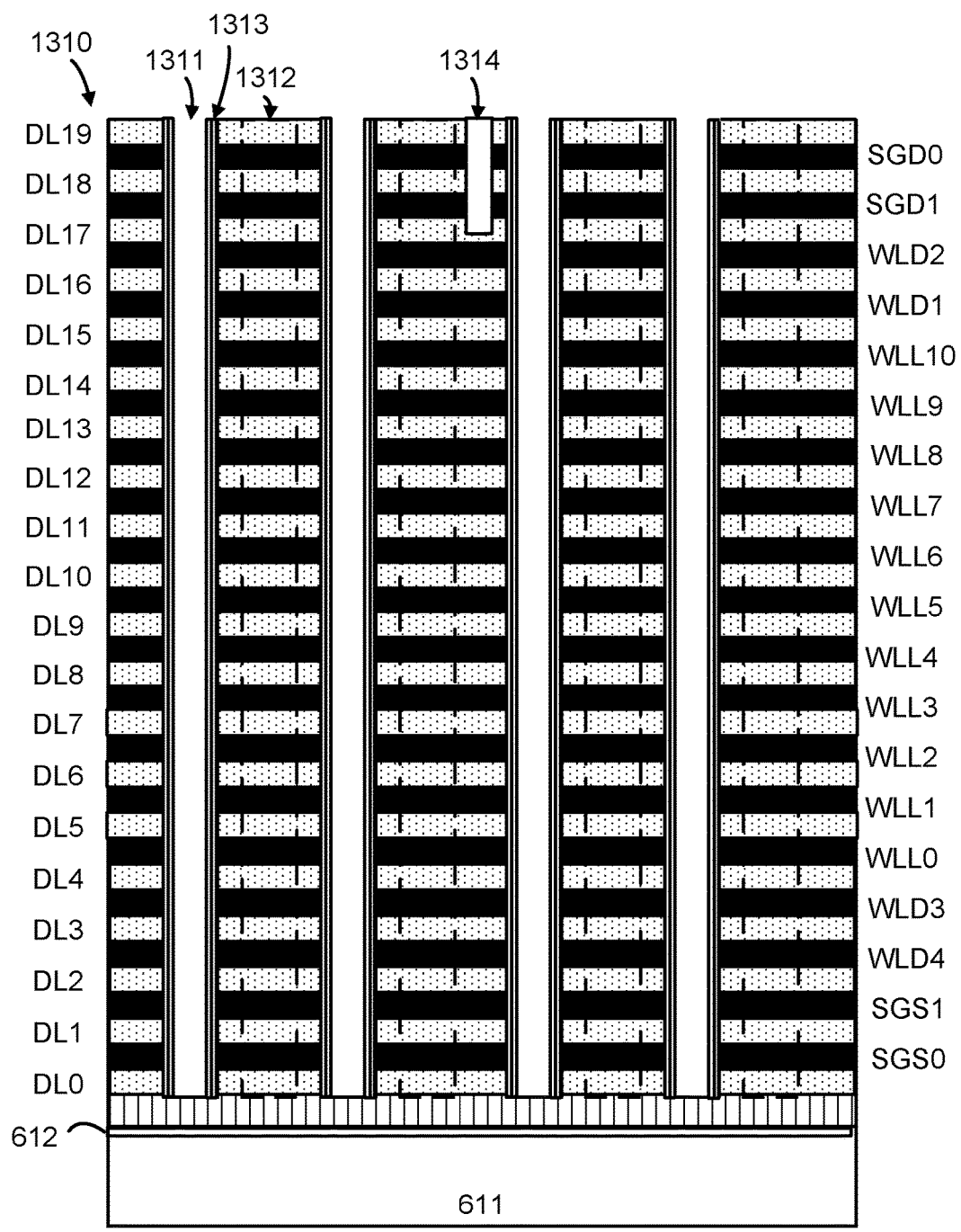
FIG. 13B depicts an example cross-sectional view of the stack of FIG. 13A after memory holes and an SGD slit are formed, consistent with step 1201 of FIG. 12A, and after layers are deposited in the memory holes, consistent with step 1202 of FIG. 12A.

FIG. 13B depicts an example cross-sectional view of the stack of FIG. 13A after memory holes and an SGD slit are formed, consistent with step 1201 of FIG. 12A, and after layers are deposited in the memory holes, consistent with step 1202 of FIG. 12A. The stack 1310 includes memory holes including example memory hole 1311 which is visible in the cross-sectional view and memory hole 1312 which is projected by a dashed line onto the cross-sectional view. The blocking oxide layer, charge trapping layer, tunneling layer and channel layer are represented by the films 1313 along the sidewall of the memory hole 1311. The SGD slit 1314 is depicted as being etched and filled in at this stage.

FIG. 13C depicts an example cross-sectional view of the stack of FIG. 13B after a material 1315 for a mask is provided on the stack, consistent with step 1210 of FIG. 12B and step 1220 of FIG. 12C. The material may be, e.g., photoresist or a hard mask, as discussed. The mask material is sufficiently solid to avoid running into the memory holes. For example, in the case of spin on glass, it is a solvent-based liquid, but after spinning and baking the solvent will evaporate, so that it is solidified, similar to photoresist.

FIG. 13D1 depicts an example cross-sectional view of the stack of FIG. 13C after the mask material is etched to form a mask over an interior region of memory holes, consistent with step 1210 of FIG. 12B, step 1220 of FIG. 12C and step 1246 of FIG. 12E. The mask covers the memory holes in the interior region 1021 of the stack. However, the mask does not cover the memory holes in the first and second edge regions 1020 and 1022, respectively, of the stack so that these regions are exposed and can be doped. See FIG. 10A.

Or, the doped channel layer material can be deposited into the memory holes of the edge regions 1020 and 1022 in the process of FIG. 12E (step 1247).

Note that FIG. 13A-17B depict a portion of a block. The structures and patterns depicted for the portion can be repeated in each portion of a block and across multiple blocks in a memory device.

FIG. 13D2 depicts an example cross-sectional view of the stack of FIG. 13C after the mask material is etched to form a mask over edge regions of memory holes, consistent with step 1243 of FIG. 12E. The mask portions 1315b and 1315c cover the edge regions 1020 and 1022, respectively, of memory holes. The undoped channel layer material can therefore be deposited into the memory holes of the interior region 1021 in the process of FIG. 12E (step 1244).

Figure 14:
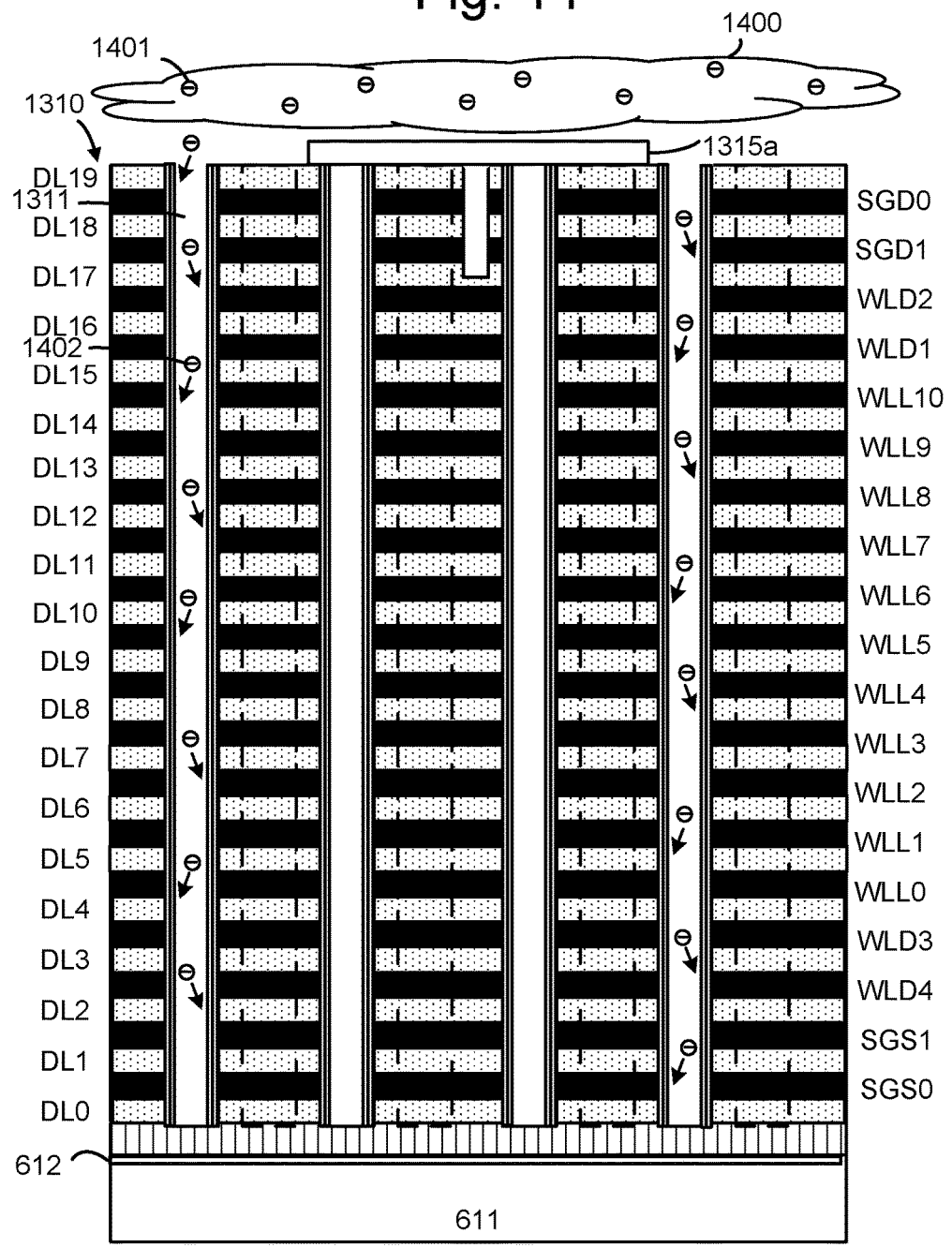
FIG. 14 depicts an example cross-sectional view of the stack of FIG. 13D1 when a carrier gas is supplied consistent with step 1211 of FIG. 12B.

FIG. 14 depicts an example cross-sectional view of the stack of FIG. 13D1 when a carrier gas 1400 is supplied consistent with step 1211 of FIG. 12B. The gas comprises dopant ions such as example dopant ion 1401 which remains above the stack and dopant ions such as example dopant ion 1402 which enters the memory hole 1311. Some of the dopant ions will travel into the memory holes and diffuse into the channel layers along the height of the hole.

Figure 15A:
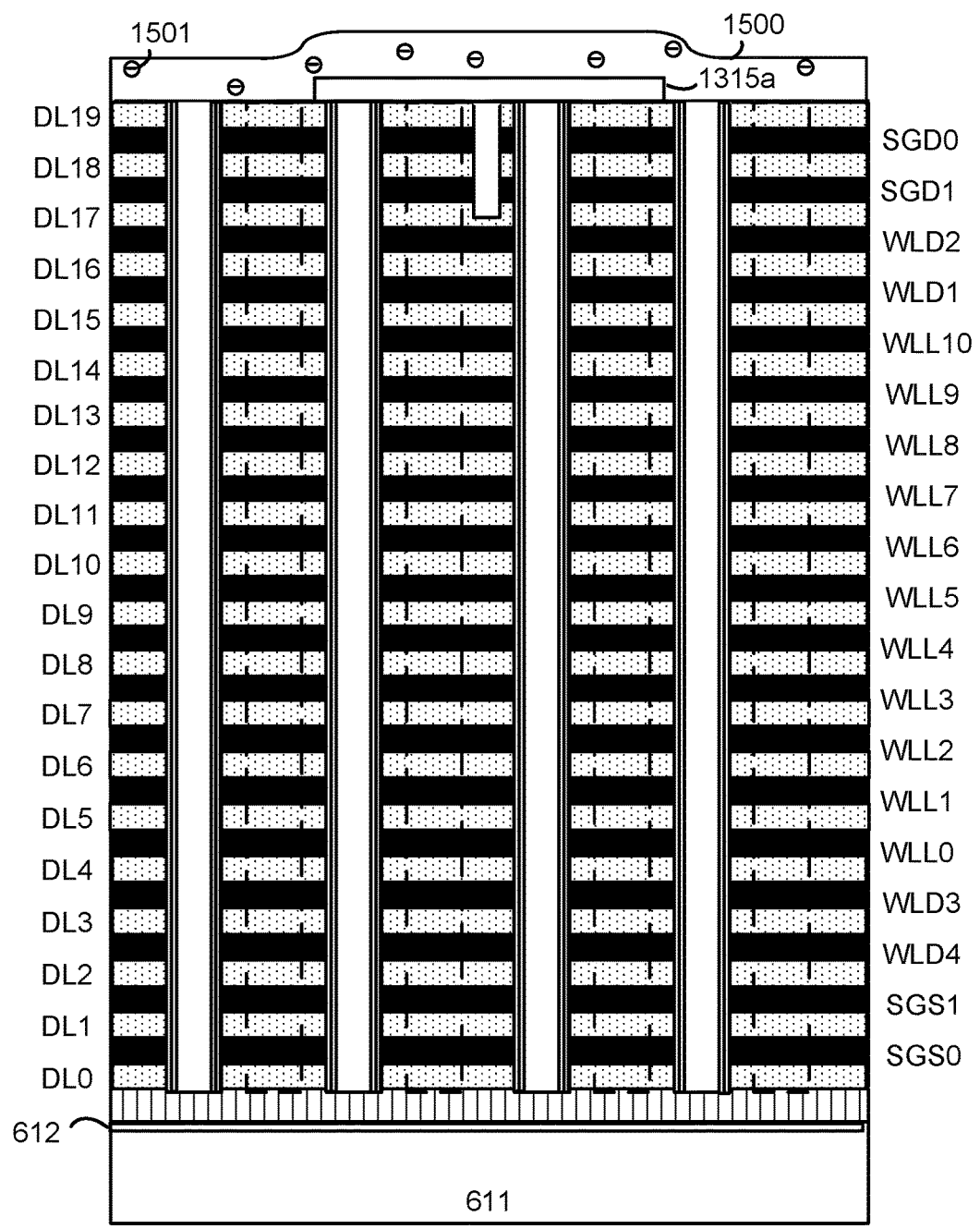
FIG. 15A depicts an example cross-sectional view of the stack of FIG. 13D1 after doped spin on glass is deposited consistent with step 1221 of FIG. 12C.

FIG. 15A depicts an example cross-sectional view of the stack of FIG. 13D1 after doped spin on glass is deposited consistent with step 1221 of FIG. 12C. The glass 1500 comprises dopant ions such as example dopant ion 1501 which initially remain above the stack.

Figure 15B:
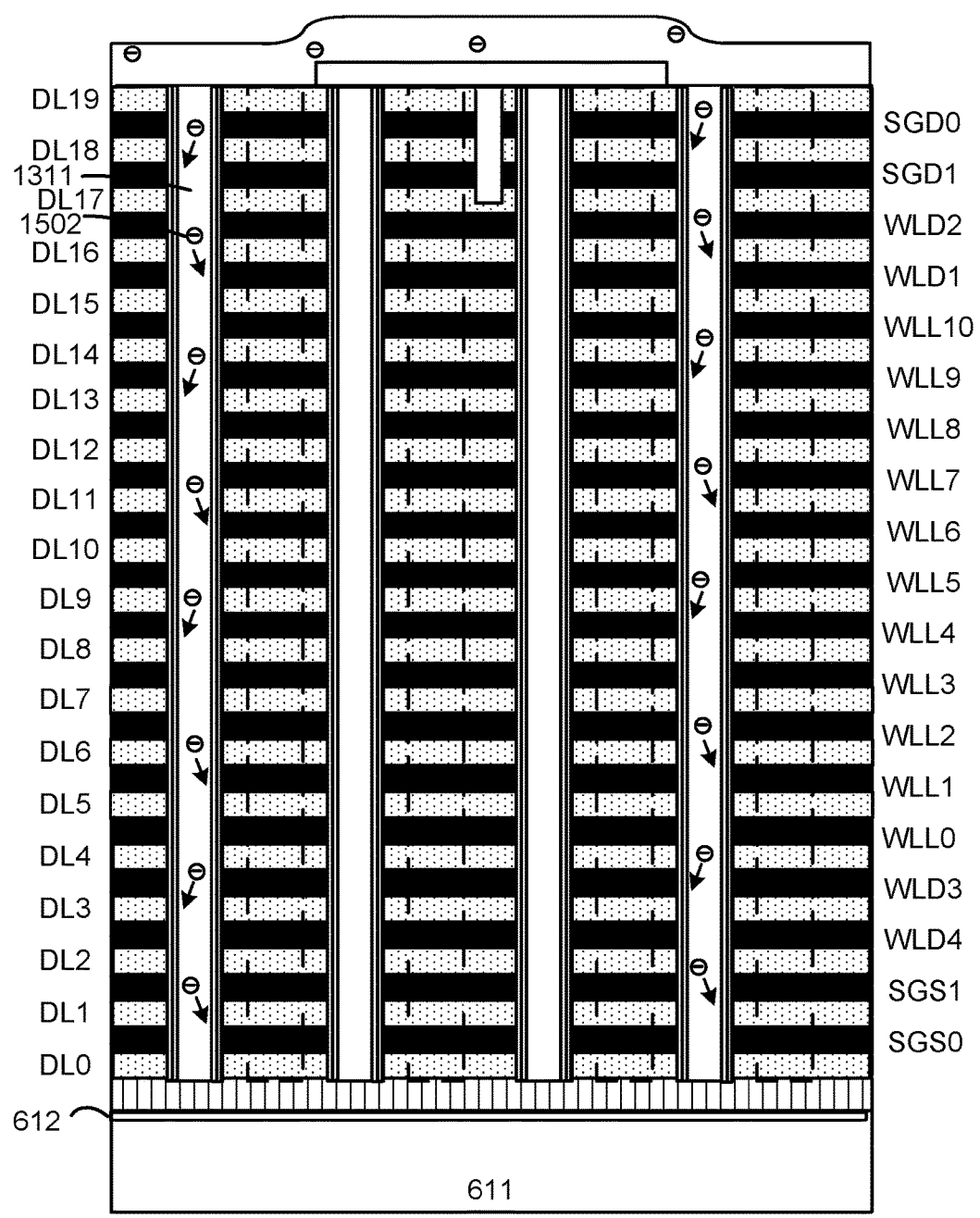
FIG. 15B depicts an example cross-sectional view of the stack of FIG. 15A after the heating steps 1222 and 1224 of FIG. 12C.

FIG. 15B depicts an example cross-sectional view of the stack of FIG. 15A after the heating steps 1222 and 1224 of FIG. 12C. The initial heating causes the dopant ions such as example dopant ion 1502 to diffuse out of the glass and into the memory hole 1311. Some of the dopant ions will travel into the memory holes and diffuse into the channel layers along the height of the hole. A further heating at a higher temperature drives the dopant ions further into the channel layers.

FIG. 16A depicts an example cross-sectional view of the stack of FIG. 13D1 after slits 1601 and 1602 are formed in the stack, consistent with step 1205 of FIG. 12A. The slits 1601 and 1602 may be formed by etching and may extend along the z-axis and the x-axis along the stack. Sacrificial material 1603 of the control gate layers is depicted. Material 1604 of the dielectric layers is also depicted.

FIG. 16B depicts an example cross-sectional view of the stack of FIG. 16A after the sacrificial material 1603 of the control gate layers is removed by providing an etchant in the slit, thereby forming a void 1605, consistent with step 1206 of FIG. 12A.

Figure 16C:
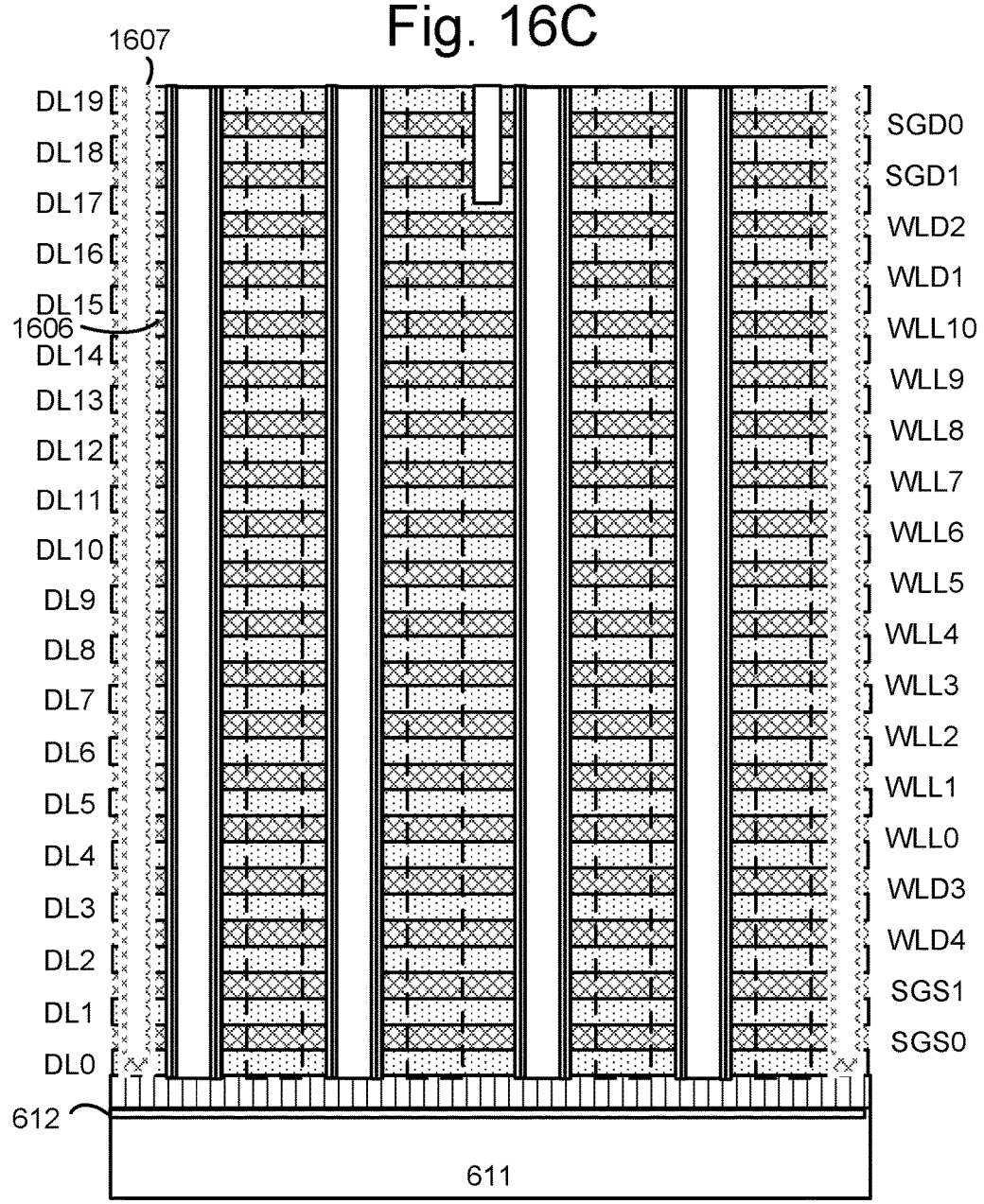
FIG. 16C depicts an example cross-sectional view of the stack of FIG. 16B after depositing a metal in the control gate layers via the slit, consistent with step 1207 of FIG. 12A.

FIG. 16C depicts an example cross-sectional view of the stack of FIG. 16B after depositing a metal in the control gate layers via the slit, consistent with step 1207 of FIG. 12A. The metal includes portions such as the portion 1606 which fills the voids of the control gate layers, and a portion 1607 which lines the slit.

FIG. 16D depicts an example cross-sectional view of the stack of FIG. 16C after cleaning and filling in the slit, consistent with step 1207 of FIG. 12A. The metal which lines the slit is cleaned away to avoid short circuiting the control gate layers. After the cleaning, an insulating liner 1621 such as $SiO_2$ is deposited in the slit and the bottom of the liner is etched through. An adhesion layer such as titanium nitride (TiN) may be deposited before the metal 1622. The metal forms a continuous conductive path from a bottom of the stack to the top of the stack and can therefore act as a local interconnect. Local interconnects 1620 and 1630 are thus formed.

Figure 17A:
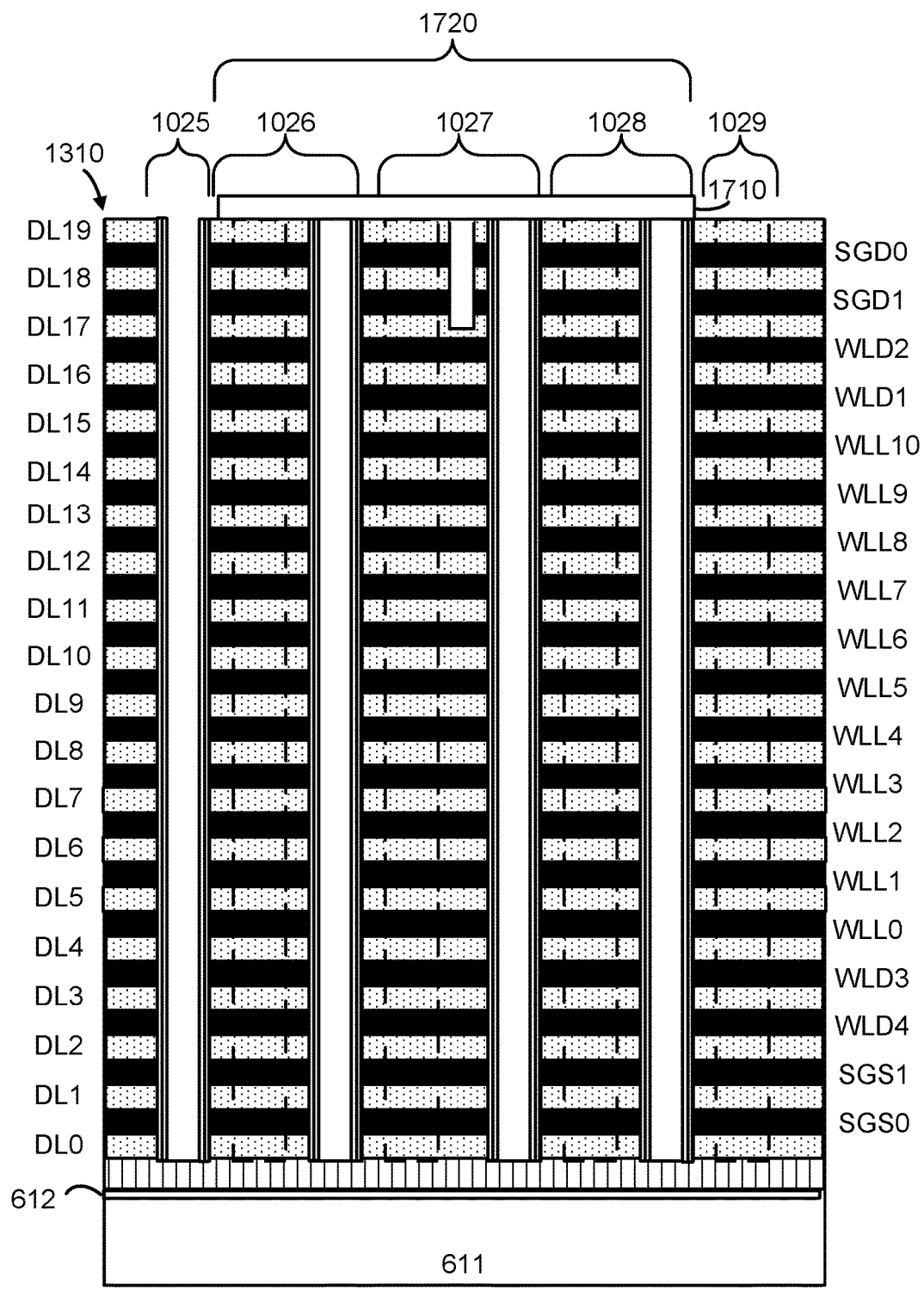
FIG. 17A depicts an example cross-sectional view of the stack of FIG. 13B after a first mask is formed on the stack over the interior region 1027 of memory holes and the first and second intermediate regions 1026 and 1028, respectively, of memory holes of FIG. 10D, consistent with step 1230 of FIG. 12D.

FIG. 17A depicts an example cross-sectional view of the stack of FIG. 13B after a first mask is formed on the stack over the interior region 1027 of memory holes and the first and second intermediate regions 1026 and 1028, respectively, of memory holes of FIG. 10D, consistent with step 1230 of FIG. 12D. A continuous masked region 1720 is denoted. The mask does not cover the memory holes in the first and second edge regions 1025 and 1029, respectively, of the stack, so that these regions are exposed and can be doped.

Figure 17B:
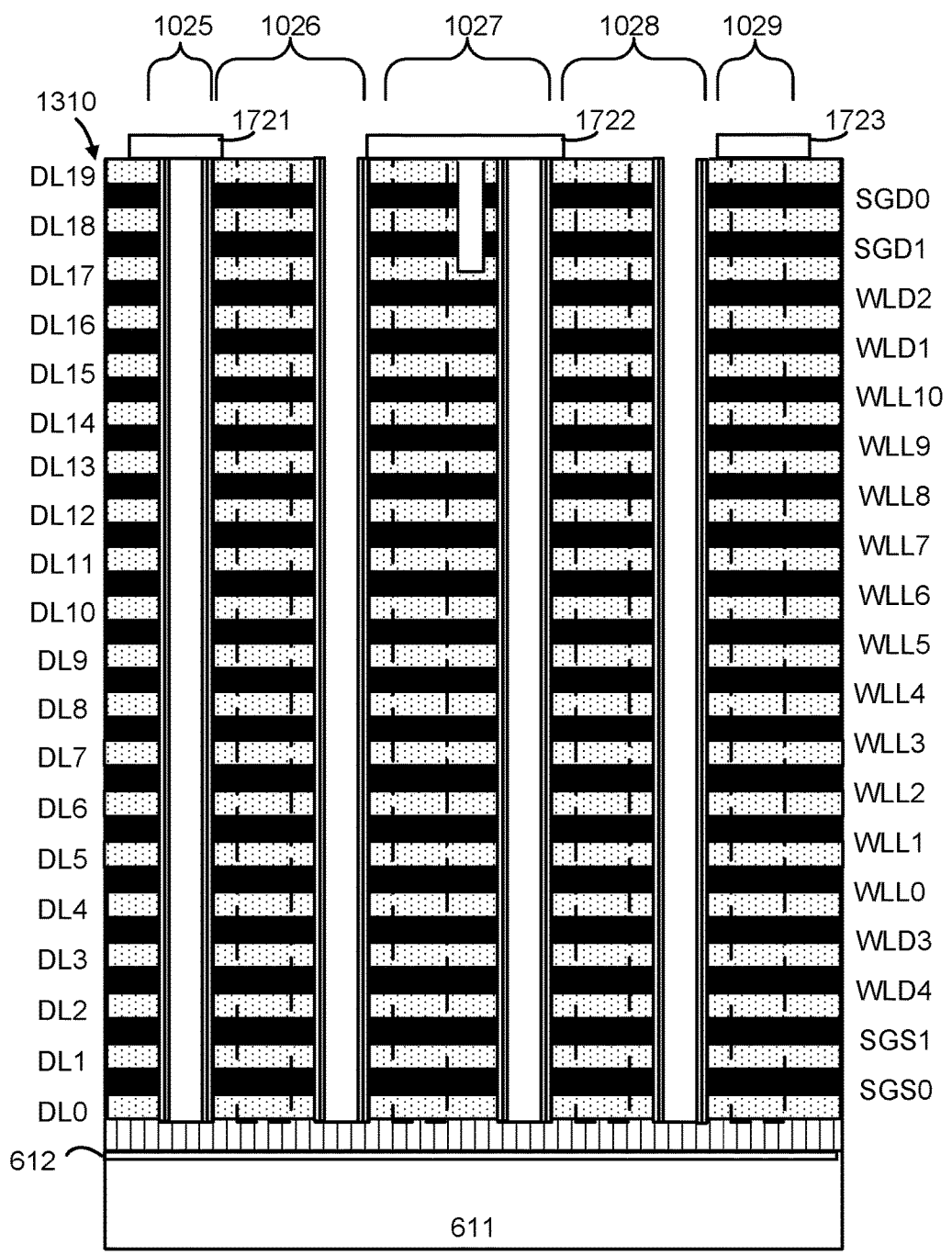
FIG. 17B depicts an example cross-sectional view of the stack of FIG. 13B after a second mask is formed on the stack over the interior region 1027 of memory holes and the first and second edge regions 1025 and 1029, respectively, of memory holes of FIG. 10D, consistent with step 1233 of FIG. 12D.

FIG. 17B depicts an example cross-sectional view of the stack of FIG. 13B after a second mask is formed on the stack over the interior region 1027 of memory holes and the first and second edge regions 1025 and 1029, respectively, of memory holes of FIG. 10D, consistent with step 1233 of FIG. 12D. The mask portions 1721, 1722 and 1723 do not cover the memory holes in the first and second intermediate regions 1026 and 1028, respectively, of the stack, so that these regions are exposed and can be doped.

Figure 18:
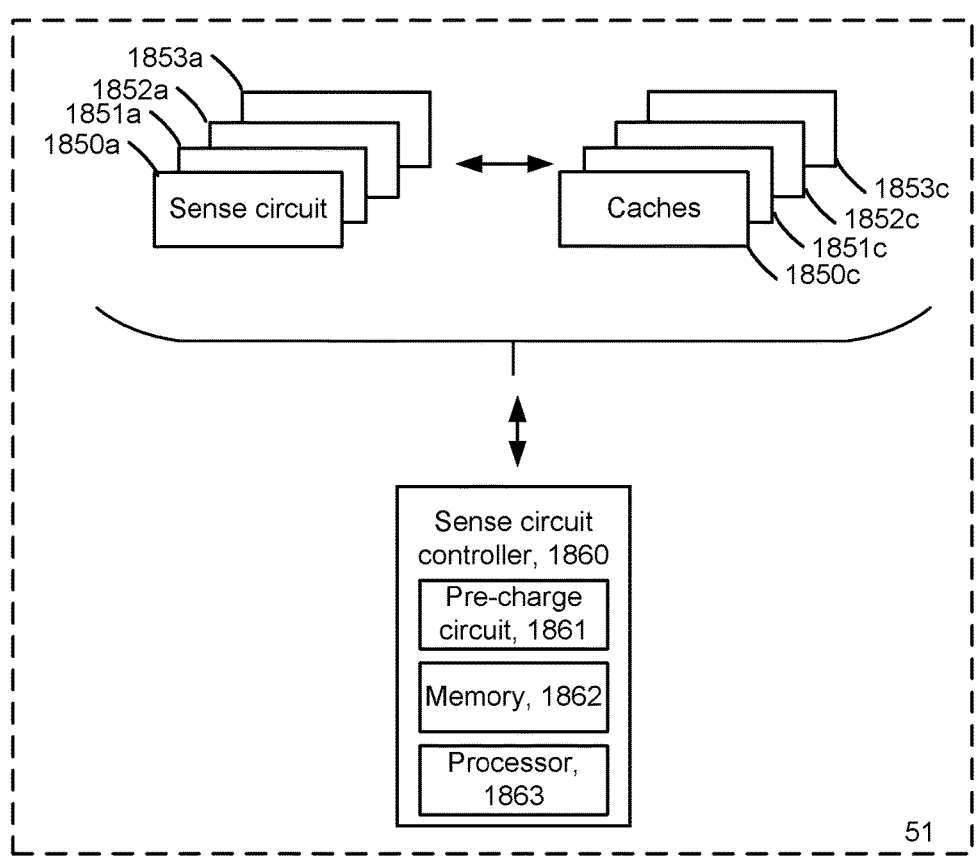
FIG. 18 depicts an example block diagram of a sense block 51 in the column control circuitry of FIG. 1.

FIG. 18 depicts an example block diagram of a sense block 51 in the column control circuitry of FIG. 1. The column control circuitry can include multiple sense blocks, where each sense block performs sensing, e.g., read, program verify or erase verify operations for multiple memory cells via respective bit lines.

In one approach, a sense block comprises multiple sense circuits, also referred to as sense amplifiers. Each sense circuit is associated with data latches and caches. For example, the example sense circuits 1850$a$, 1851$a$, 1852$a$ and 1853$a$ are associated with caches 1850$c$, 1851$c$, 1852$c$ and 1853$c$, respectively.

In one approach, different subsets of bit lines can be sensed using different respective sense blocks. This allows the processing load which is associated with the sense circuits to be divided up and handled by a respective processor in each sense block. For example, a sense circuit controller 1860 can communicate with the set, e.g., sixteen, of sense circuits and latches. The sense circuit controller may include a pre-charge circuit 1861 which provides a voltage to each sense circuit for setting a pre-charge voltage. The sense circuit controller may also include a memory 1862 and a processor 1863.

Figure 19:
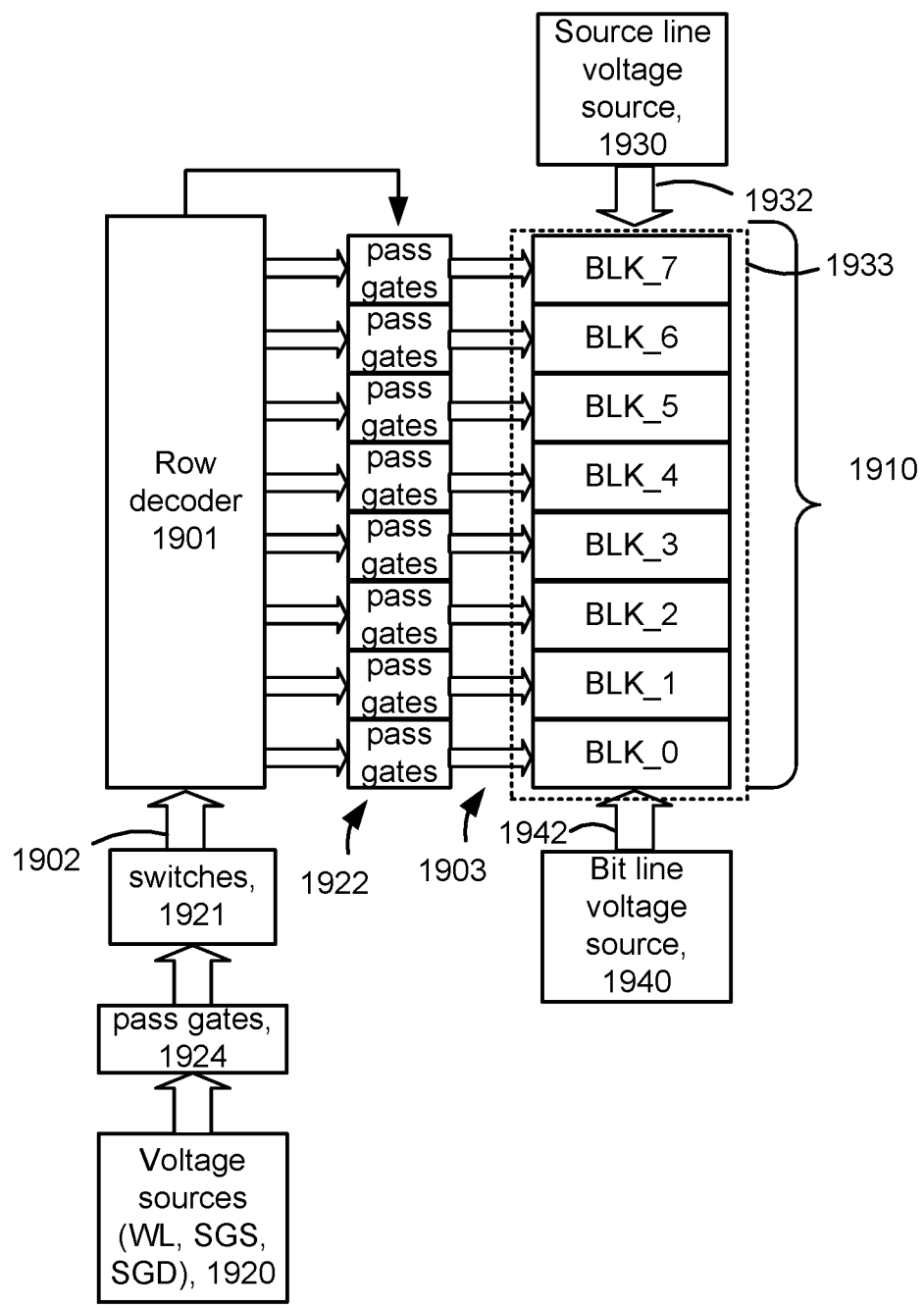
FIG. 19 depicts an example circuit for providing voltages to blocks of memory cells.

FIG. 19 depicts an example circuit for providing voltages to blocks of memory cells. In this example, a row decoder 1901 provides voltages to word lines and select gates of each block in set of blocks 1910. The set could be in a plane and includes blocks BLK0 to BLK7, consistent with FIG. 9B. The row decoder provides a control signal to pass gates 1922 which connect the blocks to the row decoder. Typically, operations, e.g., program, read or erase, are performed on one selected block at a time. The row decoder can connect global control lines 1902 to local control lines 1903. The control lines represent conductive paths. Voltages are provided on the global control lines from voltage sources 1920. The voltage sources may provide voltages to switches 1921 which connect to the global control lines. Pass gates 1924, also referred to as pass transistors or transfer transistors, are controlled to pass voltages from the voltage sources 1920 to the switches 1921.

The voltage sources 1920 can provided voltages on word lines (WL), SGS control gates and SGD control gates, for example.

The various components, including the row decoder, may receive commands from a controller such as the state machine 112 or the controller 122 to perform the functions described herein.

A source line voltage source 1930 provides a voltage to the source lines/diffusion region in the substrate via control lines 1932. In one approach, the source diffusion region 1933 is common to the blocks. A set of bit lines 1942 is also shared by the blocks. A bit line voltage source 1940 provides voltages to the bit lines. In one possible implementation, the voltage sources 1920 are near the bit line voltage source.

Figure 20:
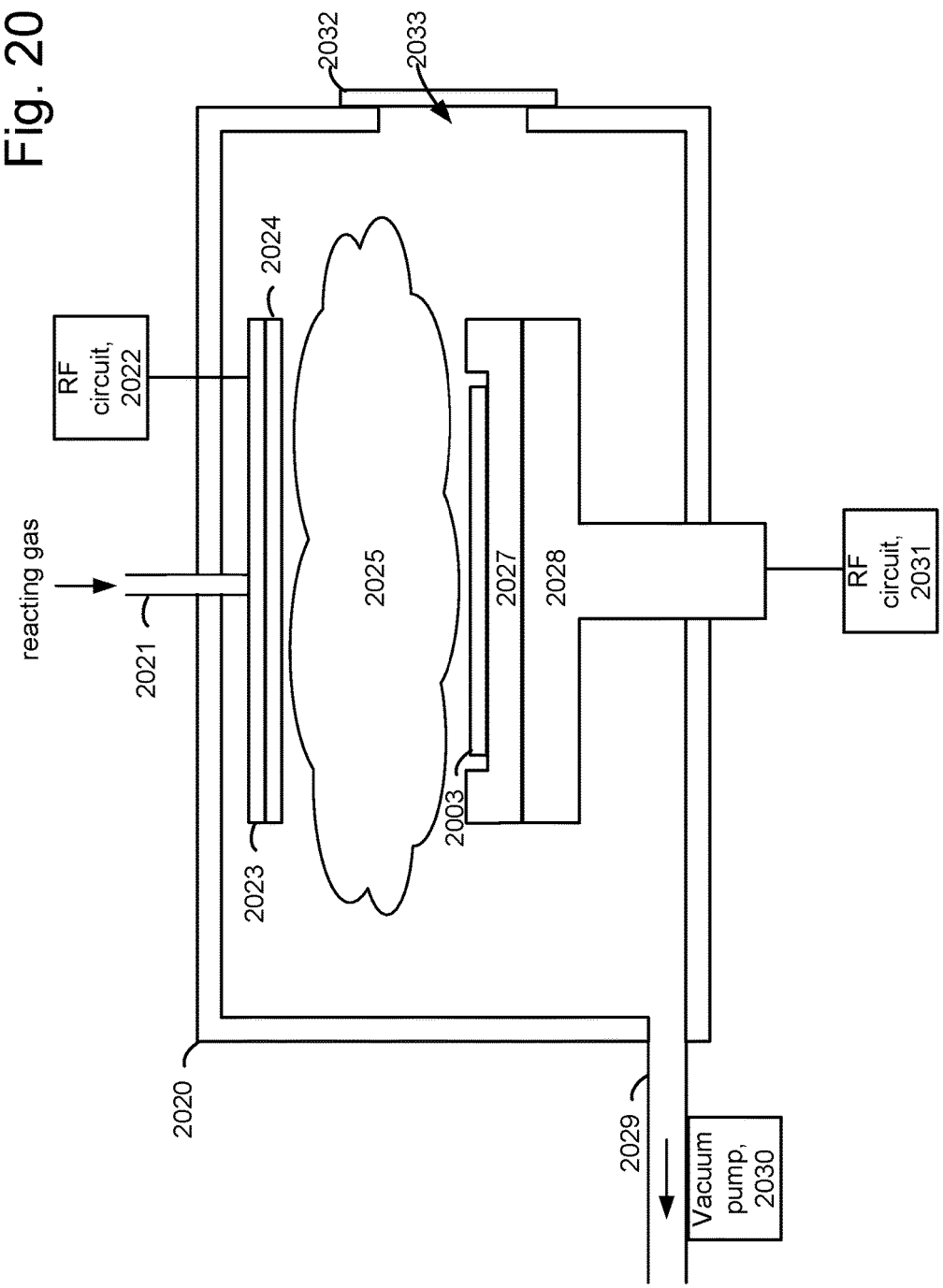
FIG. 20 depicts an apparatus for performing a plasma doping process.

FIG. 20 depicts an apparatus for performing a plasma doping process. The chamber 2020 includes an inlet 2021 for a reacting gas and an outlet 2029 or exhaust connected to a vacuum pump 2030 which provides a vacuum in the chamber. The wafer 2003 is held in a top plate 2027 on a heating block 2028. The heating block can be used to set the temperature of the wafer and the chamber. The wafer can be loaded and unloaded via an opening 2033 and a gate valve 2032.

A gas comprising the dopant enters the chamber via a showerhead 2024. The showerhead has many holes facing the wafer which uniformly inject the gas into the chamber toward the wafer. The showerhead is electrically connected to an RF circuit 2022 via an electrode 2023. The wafer is electrically connected to an RF circuit 2031 via the top plate 2027 and the heating block 2028 which form another electrode.

The power from the RF circuit 2022 is used to generate a plasma cloud 2025 in the chamber. A plasma is a gas in which a significant percentage of the atoms or molecules are ionized. The power supplied by the RF circuit 2022 controls the density of the plasma, e.g., the number of available ions. The dopant ions enter the exposed memory holes and diffuse into the channel layers.

The electrode connected to the substrate provides a bias on the substrate that pulls the charged ions toward the substrate. This bias thus affects the energy of the ions. Other factors such as pressure also affect the energy.

In one embodiment, a memory device comprises: a plurality of word line layers which are vertically spaced apart from one another by dielectric layers in a stack; and a set of memory strings extending through the plurality of word line layers. The set of memory strings are arranged between first and second isolation regions which extend vertically in the stack, the set of memory strings comprises memory strings in a first edge region of the stack adjacent to the first isolation region, a second edge region of the stack adjacent to the second isolation region, and an interior region between the first and second edge regions, the memory strings in the first and second edge regions comprising doped channels and the memory strings in an interior region between the first and second edge regions comprising undoped channels.

In another embodiment, a method for fabricating a memory device comprises: etching a set of memory holes in a plurality of word line layers, the plurality of word line layers are vertically spaced apart from one another by dielectric layers in a stack, the set of memory holes are arranged between first and second isolation regions which extend vertically a height of the stack, the set of memory holes comprises memory holes in a first edge region of the stack adjacent to the first isolation region, a second edge region of the stack adjacent to the second isolation region, and an interior region between the first and second edge regions; depositing a channel layer in the set of memory holes; masking the memory holes in the interior region; and while the memory holes in the interior region are masked, doping the channel layers in the memory holes of the first and second edge regions.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for fabricating a memory device, comprising:
etching a set of memory holes in a plurality of word line layers, the plurality of word line layers are vertically spaced apart from one another by dielectric layers in a stack, the set of memory holes are arranged between first and second isolation regions which extend vertically a height of the stack, the set of memory holes comprises memory holes in a first edge region of the stack adjacent to the first isolation region, a second edge region of the stack adjacent to the second isolation region, and an interior region between the first and second edge regions;
depositing a channel layer in the set of memory holes;
masking the memory holes in the interior region; and
while the memory holes in the interior region are masked, doping the channel layers in the memory holes of the first and second edge regions.

2. The method of claim 1, wherein:
the doping the channel layers in the memory holes of the first and second edge regions comprises depositing a doped spin on glass over the memory holes of the first and second edge regions and heating the doped spin on glass to cause dopant to diffuse from the spin on glass into the memory holes of the first and second edge regions and into the channel layers in the memory holes of the first and second edge regions.

3. The method of claim 1, wherein:
the doping the channel layers in the memory holes of the first and second edge regions comprises depositing a doped solid over the memory holes of the first and second edge regions and heating the doped solid to cause dopant to diffuse from the solid into the memory holes of the first and second edge regions and into the channel layers in the memory holes of the first and second edge regions.

4. The method of claim 1, wherein:
the doping comprises supplying an n-type dopant to the channel layers in the memory holes of the first and second edge regions using plasma doping.

5. The method of claim 1, wherein:
the doping the channel layers in the memory holes of the first and second edge regions comprises supplying a carrier gas enriched with an n-type dopant to the memory holes of the first and second edge regions.

6. The method of claim 1, wherein:
the memory holes in the set of memory holes have equal widths.

7. The method of claim 1, wherein:
the doping comprises supplying an n-type dopant to the channel layers in the memory holes of the first and second edge regions.

8. The method of claim 1, wherein:
the plurality of word lines layers are separate from one another by dielectric layers in a stack;
the plurality of word lines layers are formed by etching away nitride layers in the stack by supplying an etchant to the first edge region and the second edge region before the interior region, thereby forming voids in the stack between the dielectric layers, and subsequently supplying a metal in the voids.

9. The method of claim 8, further comprising:
depositing a blocking oxide layer in the set of memory holes before the depositing of the channel layer, the supplying of the etchant to the first edge region and the second edge region before the interior region results in the blocking oxide layer of the memory holes of the first and second edge regions becoming thinner than the blocking oxide layer of the memory holes of the interior region.

* * * * *